United States Patent [19]

Crooks et al.

[11] 4,318,043
[45] Mar. 2, 1982

[54] METHOD AND APPARATUS FOR RAPID NMR IMAGING OF NUCLEAR DENSITIES WITHIN AN OBJECT

[75] Inventors: Lawrence E. Crooks, Richmond; John C. Hoenninger, III, Berkeley; Mitsuaki Arakawa, San Mateo, all of Calif.

[73] Assignee: The Regents of the University of California, Berkeley, Calif.

[21] Appl. No.: 120,875

[22] Filed: Feb. 12, 1980

Related U.S. Application Data

[63] Continuation-in-part of Ser. No. 926,571, Jul. 20, 1978.

[51] Int. Cl.³ ............................................. G01N 27/00
[52] U.S. Cl. .................................................. 324/309
[58] Field of Search .......................... 324/300, 307, 309

[56] References Cited

U.S. PATENT DOCUMENTS

| | | |
|---|---|---|
| 3,812,418 | 5/1974 | Tschopp . |
| 3,932,805 | 1/1976 | Abe . |
| 4,015,196 | 3/1977 | Moore ................................. 324/309 |
| 4,021,726 | 5/1977 | Garroway ........................... 324/309 |
| 4,070,611 | 1/1978 | Ernst . |
| 4,087,738 | 5/1978 | Van Degrift . |
| 4,095,168 | 6/1978 | Hlavka . |
| 4,115,730 | 9/1978 | Mansfield ............................ 324/309 |

*Primary Examiner*—Michael J. Tokar
*Attorney, Agent, or Firm*—Larry S. Nixon

[57] ABSTRACT

Densities of resonant nuclei within elemental volumes along a line are measured using the nuclear magnetic resonance phenomenon called "spin echo". A first planar volume of nuclei is selectively excited to nutate spins by approximately 90°. Thereafter a second planar volume of nuclei, transverse to the first planar volume, is selectively excited to nutate spins by approximately 180°. The nuclei in the line volume common to both of the planar volumes thereafter generate characteristic spin echo signals. A magnetic gradient is established along this line volume during the spin echo read out so that the resultant spin echo signals can be processed to determine the respective densities of resonant nuclei along the line volume. Appropriate phasing of the excitations enables interference with the spin echo signals by the free induction decay to be eliminated. To enable rapid development, successive line volumes are read out which do not lie in previously excited planes.

65 Claims, 23 Drawing Figures

FIG. 1
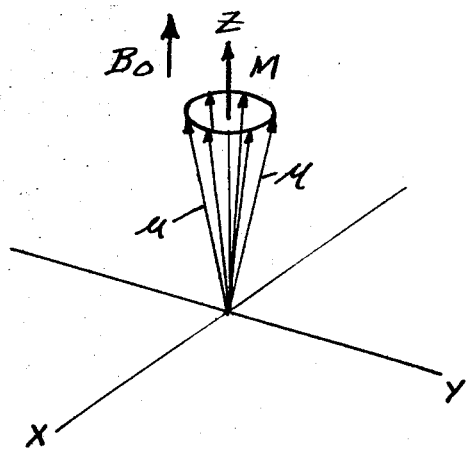
FIG. 1A
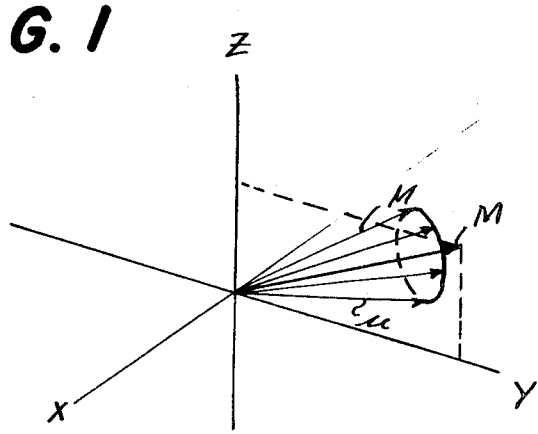
FIG. 1B
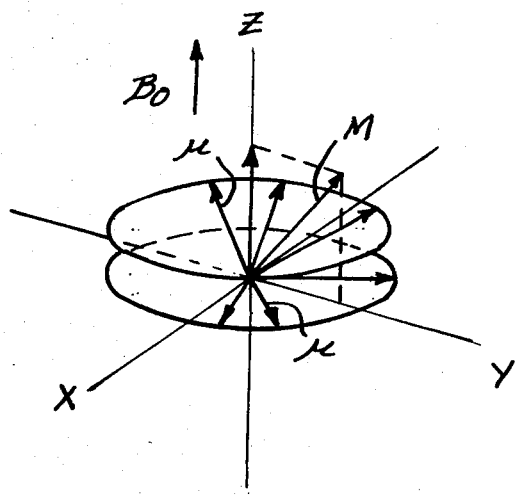
FIG. 1C
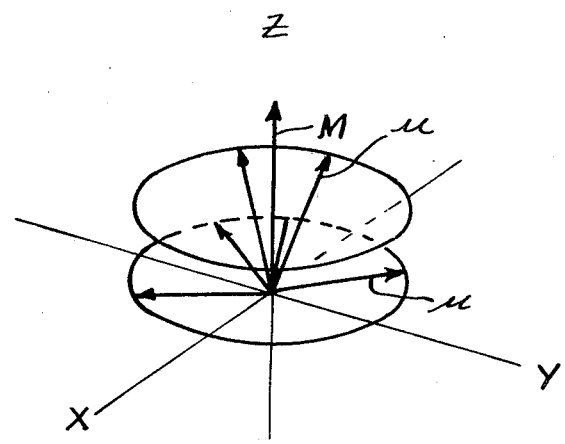
FIG. 1D
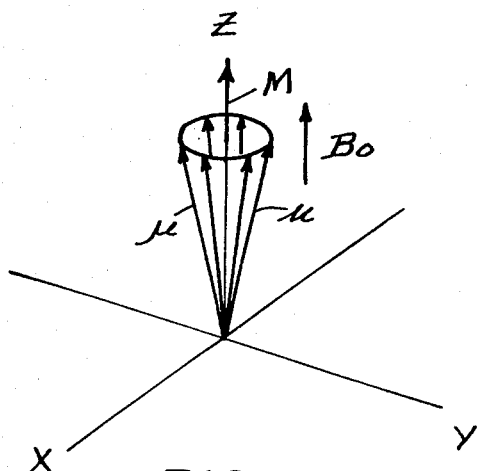
FIG. 1E

SPIN ECHO SEQUENCE

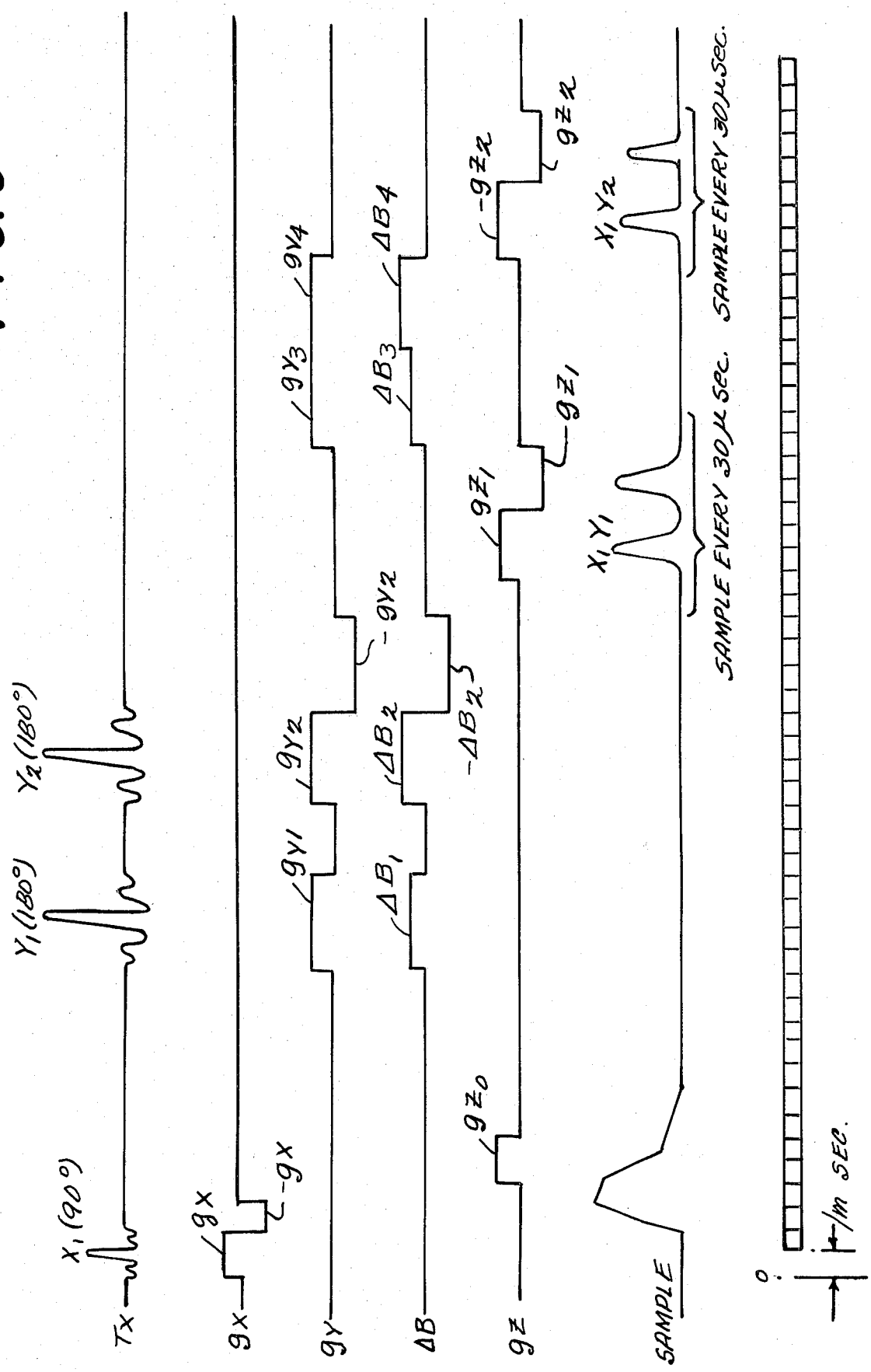

METHOD AND APPARATUS FOR RAPID NMR IMAGING OF NUCLEAR DENSITIES WITHIN AN OBJECT

This is a continuation-in-part of copending U.S. application Ser. No. 926,571 to Crooks et al entitled "METHOD AND APPARATUS FOR MAPPING LINES OF NUCLEAR DENSITY WITHIN AN OBJECT USING NUCLEAR MAGNETIC RESONANCE", filed July 20, 1978, the contents of which are incorporated herein by reference.

FIELD OF THE INVENTION

The present invention relates to apparatus and method for producing a cross-sectional image of relative nuclear densities inside an object. More particularly, it involves the use of nuclear magnetic resonance techniques for in vivo mapping of lines of resonant nuclei densities in a human or other animal.

BACKGROUND OF THE INVENTION

Presently used techniques for non-invasive examination of a body use X-ray (e.g., computerized tomography) and ultrasound procedures. Another non-invasive procedure uses nuclear magnetic resonance (NMR) to obtain a cross-sectional image of the nuclei densities within a body. The average atomic number (Z) of nuclei in tumors tends to be significantly different from that of normal tissue. Hydrogen nuclear densities detected by NMR techniques are presently considered a strong indicator of changes in the average atomic number Z in tissues since hydrogen is the most abundant odd mass numbered nucleus present in living tissues. NMR is ideally suited for mapping relative hydrogen nuclear densities within living tissues.

In general, the principles of NMR are well known. All nuclei with an odd number of protons or neutrons behave, in effect, like small magnets. When placed in a steady external magnetic field, the magnetic axes of such nuclei (and hence of the atoms) precess at an angle about the imposed field axis at the so-called Larmor frequency. The Larmor frequency ($f_o$) is related to the magnetic field ($B_0$) at the nucleus by the equation $f_o = \gamma B_0$ where $\gamma$ is a constant, the magnetogyric ratio characteristic of a particular type of nuclei.

Where a magnetic field gradient exists through an object, or if non-homogeneities exist in the imposed magnetic field, nuclei having the same magnetogyric ratio $\gamma$ will have different Larmor frequencies in accordance with their positions within the object. A volume of nuclei in the object can thus be conceptualized as having a range of precession frequencies centered about a given Larmor frequency.

It is convenient to view the nuclear process about to be described from a rotating frame of reference which rotates at the Larmor frequency such that a nuclear magnetic moment precessing at exactly the Larmor frequency appears to be substantially stationary. In this frame of reference, the macroscopic magnetization M is aligned with the direction of the imposed magnetic field $B_0$. This is illustrated in FIG. 1A.

As is well known, the direction of net angular momentum or "spin" of a group of nuclei (and thus their net magnetic axis) can be reoriented with respect to the external magnetic field by electromagnetic signals having a frequency equal to the Larmor frequency. The electromagnetic signal produces a stationary magnetic field in the rotating frame of reference to nutate (reorient) the net spin of resonant (Larmor frequency) nuclei by an amount in accordance with its amplitude and duration. The direction of nutation is a function of the phase of the electromagnetic signal with respect to the nuclear precession about the imposed magnetic field. Thus, as illustrated in FIG. 1B, magnetic moment M has been nutated away from the Z axis.

Over a period of time, after removal of the electromagnetic signal, the many magnetic moments $\mu$ will realign parallel to external field $B_0$. As nuclear realignment occurs, the relative phases of the individual spins (where phase is defined as the angle between the projection of the spin on a plane in the rotating frame of reference and an axis in this plane, which passes through the axis of rotation) begin to diverge as some nuclei precess faster and some slower than the central Larmor frequency. Thus, there is a gradual "dephasing" of the individual nuclear spins and a consequent loss of phase coherence. In a perfectly uniform magnetic field, such "dephasing", as illustrated in FIG. 1C, results from natural processes that cause nuclei to exchange energy with each other. The length of time that such "dephasing" takes to occur is related to the spin-spin, or transverse, relaxation time constant $T_2$. In a non-uniform field, additional dephasing is caused by the different frequencies at different positions within the object. The time constant associated with the combination of this effect and $T_2$ is known as $T_2^*$.

During realignment, as illustrated in FIG. 1B, the nuclear moments $\mu$ also lose energy to their surroundings and thus relax, reorienting parallel to $B_0$. This process is illustrated in FIG. 1D. The spin-lattice, or longitudinal, relaxation time constant $T_1$, is related to this time of relaxation. Thus, as illustrated in FIG. 1E, after full relaxation, the macroscopic magnetization has reached its equilibrium value $M_0$ and is aligned parallel to the imposed magnetic field $B_0$.

Assuming the nuclear spins to be initially aligned as in FIG. 1A, and then reoriented transverse to the initial direction, as in FIG. 1B, the net nuclear magnetization in the X-Y plane (see FIG. 1B) will induce a characteristic RF signal in an appropriately oriented coil connected to an RF signal receiver. Initially upon reorientation, a relatively strong voltage is induced in the receiver coils which gradually decreases in amplitude due field inhomogeneity and to energy exchange between spins (the net relaxation time constant is $T_2^*$). This signal is called the free induction decay (FID).

As is also well known, a "spin echo" or subsequent representation of the FID can be generated by bringing the respective spins back into phase coherence.

For example, if, at a time $\tau$ after the nuclear spins are reoriented (for example 90° with respect to an initial direction) by a first electromagnetic pulse of appropriate frequency, magnitude and duration (hereinafter referred to as a 90° pulse), another electromagnetic signal of appropriate frequency, magnitude and duration is applied to effect a 180° nutation of the nuclear spins (hereinafter referred to as a 180° pulse) each individual spin is effectively rotated by 180° (in the rotating frame of reference). This means that the phase is now the negative of the phase accumulated before the 180° pulse. The accumulation of further phase deviations for individual nuclear spins is the same as before and therefore, at time $2\tau$ (after the initial disturbance) all of the individual spins again come into phase coherence (the negative phase cancels the further accumulated phase).

In this manner, a so-called "spin echo" of the FID is generated. The peak amplitude of the spin echo is dependent upon the transverse relaxation time constant $T_2$. The spin echo, in effect, comprises a mirror image and echo of the FID centered about a time $2\tau$ after the initial disturbance.

It should be noted that the spin echo is always peak at a time period after the application of the 180° pulse which is equal to the time interval between application of the initial disturbance (90° pulse generating the FID) and the application of the 180° pulse. This phenomenon shall hereinafter be referred to as the "rule of equal times."

Depending on the spin-spin relaxation time (related to $T_2$), the FID following a selective 90° RF pulse may continue for a relatively long period of time. In fact, at least part of the FID will continue through the spin echo following a selective 180° RF pulse. Thus, the amplitude of the spin echo signal is in fact composed of two components: the spin echo from the unit volume, and part of the FID. Thus, since the amplitude of the spin echo signal is employed to determine the density of nuclei in the excited volume, the FID component will distort the spin echo signal, and therefore the measure of relative density related thereto.

For a more detailed description of the basic principles of NMR, reference is made to Farrar and Becker "Pulse and Fourier Transform NMR Introduction to Theory and Methods," Academic Press, New York, 1971.

While NMR techniques have long been utilized in the measurement of magnetic fields and in chemical analysis, NMR has only recently been applied to medical imaging applications. In general, NMR imaging techniques are based upon the premise that by purposefully disposing a specimen within a position-variant magnetic field (a field having an intensity which varies in accordance with position), the Larmor frequencies of the nuclei disposed at different positions are made to differ accordingly. Thus, a frequency discriminant is provided as between spins from atoms at differing positions, and the spin-density of a unit or element of volume within the excited volume of nuclei is represented by a particular frequency.

Imaging techniques utilizing NMR typically fall within five categories: imaging from projections; FONAR; sensitive point imaging; Fourier imaging; and imaging by selective irradiation.

The imaging from projections technique entails producing a multiplicity of projections from many different orientations by, for example, generating a linear field gradient within the object and recording a one dimensional projection of nuclear density in the direction defined by the gradient. An image is then reconstructed from the projections by mathematic techniques similar to those used in X-ray tomography. Such a method is described, for example, by Lauterbur, *Nature,* 242:190, March 1973.

The FONAR technique utilizes shaped magnetic fields applied across the object such that only a small resonant window within the sample produces an NMR signal. The sensitive region is then scanned through the object, for example, by physical movement. For a description of the FONAR technique, reference is made to Damadian et al., "Focusing Nuclear Magnetic Resonance (FONAR)" Visualization of a Tumor in a Live Animal, Science, Vol. 194, pp. 1430-1432, December 1976 and to U.S. Pat. No. 3,789,832 issued Feb. 5, 1974 to Damadian.

The sensitive point imaging technique, also known as spin mapping, is a method whereby the NMR signals from particular unit volumes are recorded in sequence. A magnetic field gradient, alternating at a predetermined low frequency (on the order of 50 Hz) is generated along one axis of the object. The NMR signals from all elements in the object are thus modulated at the frequency of the gradient change, with the exception of the protons located in the null plane (zero plane) of the gradient. Similar alternating gradients can be applied at asynchronous frequencies along transverse axes to, in effect, define a null point in the object at the intersection of the gradient null planes. Appropriate lowpass filtering thus provides an indication of the NMR signal from the point of intersection of the three null planes. Raster-type scanning of the object is provided by varying the relative gradients. Such a sensitive point imaging technique is described in Hinshaw, *Journal of Applied Physics,* Vol. 47, No. 8, August 1976.

A multiple sensitive point method utilizing two orthogonal alternating gradients to define a null line and a string of coherent, equally spaced phase alternated resonant radio frequency pulses, is alluded to in Andrew et al., "NMR Images by Multiple Sensitive Point Method, Application to Larger Biological Systems," *Phys. Med. Biol.* 1977, Vol. 22, No. 5, 971-974, 1977. It is stated that discrete Fourier transformation of the signal received between RF pulses is utilized to provide indicia of the proton density along the line of intersection of two alternating gradient null planes.

Fourier imaging techniques generally employ an initial RF pulse to reorient the spins of the protons in the object by 90°. During the resultant FID signal, the object is subject to successive gradients applied consecutively in quick succession along the three principal Cartesian axes of the system. The FID signal is sampled in the presence of the last applied gradient, and a three dimensional Fourier transform is performed to develop a three dimensional image. Two dimensional Fourier transform methods are also known. For a discussion of the Fourier NMR techniques, reference is made to Kumar et al., "NMR Fourier Zeugmatography" *Journal of Magnetic Resonance* 18:69-83 (1975).

Imaging by selective irradiation techniques entails use of a sequence of electromagnetic pulses with predetermined frequency spectrums. A first magnetic gradient is applied along a given axis and the object is irradiated by a sequence of electromagnetic pulses having a combined frequency spectrum having equal intensity at all Larmor frequencies across the object with the exception of a narrow band. As a result of the irradiation, all of the nuclei within the object, with the exception of a narrow plane, will be saturated. The saturated atoms are thereby rendered non-responsive to further electromagnetic signals for a period of time on the order of the spin-lattice relaxation time constant $T_1$. The first magnetic gradient is replaced by a gradient along an orthogonal direction and the object again irradiated by a sequence of electromagnetic pulses, this time having a bandwidth corresponding to a particular elementary strip within the unsaturated plane. The second sequence of pulses nutates the spins of the atoms within the predetermined strip by 90°, resulting in generation of an FID. The FID is then recorded in the presence of a magnetic gradient in the third orthogonal direction (along the direction of the strip) and a Fourier transform taken to provide the nuclear density distribution along the line. For a more detailed description of the imaging by selective irradiation, reference is made to U.S. Pat. No. 4,021,726 issued May 3, 1977 to Garroway et al.

For further descriptions of the above noted NMR imaging techniques, and other techniques, reference is made to the following articles:

P. C. Lauterbur et al., "Magnetic Resonance Zeugmatography" 18th Amper. Conf. 1974; P. Mansfield, P. K. Grannel & A. A. Maudsley, "Diffraction and Microscopy in Solids by NMR," 18th Amper. Conf. 1974, pp. 431–432; P. C. Lauterbur, "Magnetic Resonance Zeugmatography"; P. C. Lauterbur, "Flow Measurements by NMR Zeugmatography," Oct. 24, 1973; P. C. Lauterbur, "Stable Isotope Distributions by NMR," Proc. First International Conf. on Stable Isotopes Conf. 730525, May 9–18, 1973, pp. 255–260; P. C. Lauterbur, "Image Formation by Induced Local Interactions: Examples Employing Nuclear Magnetic Resonance,"*Nature*, Vol. 242, Mar. 16, 1973, pp. 190–191; P. C. Lauterbur et al., "ESR Zeugmatography—Distributions of Unpaired Electrons Within Objects," Gordon Conf. Aug. 12–16, 1974; P. C. Lauterbur et al., "In Vivo Studies of Cancer by NMR Zeugmatography," Gordon Conf. Aug. 12–16, 1974; P. C. Lauterbur, "Reconstruction in Zeugmatography—The Spatial Resolution of Magnetic Resonance Signals," Intl. Workshop on 3-D Image Reconstruction Techniques, July 16–19, 1974; A. N. Garroway, "Velocity Profile Measurements by NRM," 18th Amper. Conf. 1974, pp. 435–436; W. S. Hinshaw, "The Application of Time Dependent Field Gradients to NMR Spin Mapping," 18th Amper. Conf. 1974, pp. 433–434; J. M. S. Hutchison, J. R. Mallard & C. C. Goll, "In Vivo Imaging of Body Structures Using Proton Resonance," 18th Amper. Conf. 1974, pp. 283–284; P. Mansfield & A. A. Maudsley, "Line Scan Proton Spin Imaging in Biological Structures by NMR," *Phys. in Medicine and Biology* 21 No. 5 (1976), pp. 847–852; P. K. Grannel, "NMR Body Images," Physics Bulletin, March 1976, pp. 95–96; P. C. Lauterbur, D. M. Krammer, W. V. House, C. Chen, "Zeugmatographic High Resolution NMR Spectroscopy, Images of Chemical Inhomogeneity Within Macroscopic Objects," *American Chemical Society Journal*, 97:23, Nov. 12, 1975; P. Mansfield & P. K. Grannel, "Diffraction and Microscopy in Solids and Liquids by NMR," *Physical Review B, Vol.* 12, No. 9, Nov. 1, 1975, pp. 3618–3634; P. Mansfield, A. A. Maudsley & T. Baines, "Fast Scan Proton Density Imaging by NMR," *J. of Physics E*, Vol. 9, 1976, pp. 271–278; P. C. Lauterbur, "Bibliography on Magnetic Resonance Zeugmatography," June 3, 1975; A. N. Garroway, P. K. Grannel & P. Mansfield, "Image Formation in NMR by a Selective Irradiative Process," *J. Phys. C:* Vol. 7, 1974, pp. 457–462; A. Kumar, D. Welt & R. Ernst, "NMR Fourier Zeugmatography," *J. Mag. Res.* 18, 69–83 (1975); P. Mansfield & A. A. Maudsley, "Medical Imaging by NMR," *British Journal of Radiology* 50, 188–194 (1977); D. I. Hoult, "Zeugmatography: A criticism of the Concept of a Selective Pulse in the Presence of a Field Gradient," *J. Mag. Res.* 26, 165–167 (1977); P. Mansfield & A. A. Maudsley, "Planar Spin Imaging by NMR," *J. of Physics C.,* Vol. 9, 1976, pp. L409–412; P. Mansfield, "Proton Spin Imaging by Nuclear Magnetic Resonance," *Contemporary Physics*, Vol. 17, No. 6, 1976 pp. 553–576; R. Damadian et al., "Field Focusing Nuclear Magnetic Resonance (FONAR): Visualization of a Tumor in a Live Animal," *Science*, Vol. 194, 24 December 1976, pp. 1430–1431, E. R. Andrew, "Zeugmatography," IVth Amper. Summer School, September 1976; W. S. Hinshaw, "Image Formation by Nuclear Magnetic Resonance: The Sensitive-Point Method," *J. of Applied Physics*, Vol. 47, No. 8, August 1976; R. Damadian, M. Goldsmith & L. Minkoff, "NMR, in Cancer: XVI FONAR Image of the Live Human Body," *Physiol. Chem. and Phys.* 9, (1977), pp. 97–108; G. N. Holland & P. A. Bottomley, "A Colour Display Technique for NMR Imaging," *J. of Physics E:* 10 (1977), pp. 714–716; T. Baines & P. Mansfield, "An Improved Picture Display for NMR Imaging," *Journal of Physics E: Scientific Instruments* 9 (1976), pp. 809–811; E. R. Andrew et al., "NMR Images by the Multiple Sensitive Point Method: Application to Larger Biological Systems," *Physics in Medicine and Biology* 22, No. 5, 917–974 (1977); L. Minkoff, R. Damadian, T. E. Thomas, N. Hu, M. Goldsmith, J. Koutcher & M. Stanford, "NMR in Cancer: XVII. Dewar for a 53-Inch Superconducting NMR Magnet," *Physiol. Chem. and Phys.* 9 (1977), pp. 101–109, Ros Herman, "NMR Makes Waves in Medical Equipment Companies," *New Scientist*, Jan. 12, 1978; L. E. Crooks, T. P. Grover, L. Kaufman & J. R. Singer, "Tomographic Imaging with Nuclear Magnetic Resonance," *Investigative Radiology*, 13, 63 January –February 1978; W. S. Hinshaw, P. A. Bottomley & G. N. Holland, "Radiographic Thin-Section Image of the Human Wrist by Nuclear Magnetic Resonance,"*Nature*, Vol. 270, No. 22, 29 December, 1977, pp. 722–723; and T. C. Farrar & E.D. Becker, "Pulse and Fourier Transform NMR—Introduction to Theory and Methods," Academic Press, 1971, New York, pp. 1–33.

Further reference is made to U.S. Pat. Nos. 3,975,675 issued to Dunand et al. on Aug. 17, 1976; 4,021,726 issued to Garroway et al. on May 3, 1977; 4,015,196 issued to Moore et al. on Mar. 29, 1977; 4,034,191 issued to Tomlinson et al. on July 5, 1977; 3,789,832 issued to Damadian on Feb. 5, 1974; 3,932,805 issued to Abe et al. on Jan. 13, 1976; 3,651,396 issued to Hewitt et al. on Mar. 21, 1973; and 3,999,118 issued to Hoult on Dec. 21, 1976.

It should be appreciated that each of the above described techniques is disadvantageous in various aspects. For example, techniques developing an image from projections require extensive mathematical processing of the data. The FONAR technique apparently requires either an extremely complex system to scan the magnetic field, or some means for generating relative movement between the field and the subject.

The three dimensional Fourier transform techniques require that all planes be scanned simultaneously a multiplicity of times in order to develop sufficient data so that data from the various planes can be mathematically separated. In two dimensional Fourier transform techniques the repetition rate is limited by the $T_1$ spin-lattice relaxation time of the nuclei since each irradiation affects the entire spin system. Further, large amounts of computer storage are required.

Imaging techniques utilizing selective irradiation wherein the entire object is saturated with the exception of a single plane are disadvantageous in that such systems cannot readily be adapted for rapid sequential scanning of multiple planes. That is, before a second plane can be addressed a sufficient time must pass for the object to become unsaturated.

The present invention is directed to a technique utilizing selective irradiation of the object by electromagnetic pulses to generate spin echoes (as opposed to the detection of the free induction decay signals (FID)) to readily provide for rapid multiple plane scanning.

In general, as noted above, the phenomenon of spin echoes is well known. In the past, however, the spin echo has been used primarily for measurement of the transverse relaxation time constant $T_2$ of a specimen. An example of a system utilizing spin echoes for the measurement of the relaxation time $T_2$ in logging earth formations traversed by a bore hole, is described in U.S. Pat. No. 3,128,425 issued Apr. 7, 1964 to Codrington. Similarly, U.S. Pat. No. 3,213,355 issued to Woessner on Oct. 19, 1965 describes a system for measuring the dimensions of a container utilizing spin echoes to determine the transverse relaxation time $T_2$.

Mansfield and Maudsley, "Planar Spin Imaging by NMR," *J. Phys. C: Solid State Physics*, Vol. 9, 1976 (noted above), appears to indicate that after an FID has decayed, various signal-refocusing arrangements (selective 180° pulses, 90° pulses and various combinations with field gradient reversals) may be employed to recall the signal for signal averaging purposes. The specific mechanism of the refocusing arrangements, however, is not described in the article. In a similar vein, U.S. Pat. No. 3,781,650 issued Dec. 25, 1973 to Keller appears to describe an NMR spectrometer wherein FIDs and spin echoes are combined for purposes of interference reduction.

Also, in the aforementioned communication by Hoult (Journal of Magnetic Resonance, 26: 165–167 (1977)), it is stated that the selective irradiation techniques violate the "Uncertainty Principle" unless non-linearities present in the NMR system are exploited. Hoult states that a square selective pulse contains a wide spectrum of frequencies, and that during the time the pulse is applied the "flipped spins" dephase. However, he further contends that the situation is not irretrievable in that if the field gradient is reversed after the pulse, an echo of the pulse is formed, and in the middle of the echo for small phase angle pulses, all of the spins are in phase.

Hoult's communication implies that the shape of the selected region is essentially identical to the shape of the spectrum of the selective irradiation. However, the present inventors have noted that since the response of nuclear spins to RF magnetic field is non-linear that the shape of selected volume does not exactly correspond to the shape of the spectrum of the exciting RF magnetic field. For example a spectrum with a perfectly square block of frequencies will excite a volume which covers a frequency range slightly wider than the block of frequencies and the edges of the excited volume are sloped rather than vertical. The shape of the excited volume can be calculated using the Block equations, described in Farrar and Becker pages 7 and 8, with an appropriate time dependent RF magnetic field having the frequency spectrum being considered. The use of the Block equations also determines the spin dephasing which occurs during the RF pulse. It can be shown, thus, that Hoult's gradient reversal suggestion works even for flip angles that are not small. For a 90° flip angle the gradient reversal needed to achieve a maximum signal from the spins in the selected volume is a reversed gradient with the same strength as the original but with a duration which is about half the duration of the irradiation. The exact duration of the reversal gradient is dependent on the shape of the RF pulse. The effect of this reversed gradient is to recluster most of the spins which dephased during the selective irradiation. Since the dephasing during the selective irradiation is not linear the rephasing is not perfect, but it is substantial. After the termination of the reversed gradient one has a signal which we will consider to be an FID although Hoult calls it an echo. The other large flip angle which will be frequently used is 180°. A selective irradiation of this value requires no phase correction. The reason is that spin dephasing during the first 90° of the flip is cancelled by rephasing during the second 90° of the flip.

The gradient reversal after a selective irradiation is one of several types of phase corrections necessary to the operation of the line mapping techniques described herein. Application of a reversed gradient for a period about half the duration of the selective irradiation will be hereinafter referred to as Type I phase correction. In practice the area under the correction gradient versus time waveform is the critical factor. If the correction gradient were twice as strong it would only have to be applied for half the time. This applies to all the types of phase corrections and the descriptions use the example of equal strength only for simplicity. A second type of phase correction, hereinafter referred to as a Type II phase correction, is immediate correction for a gradient pulse that has just ended; the phase spreading which occurs in parts of the object not subject to a selective irradiation during the application of this gradient pulse is corrected by the immediate application of an equal and opposite gradient for the same amount of time as the original gradient pulse. An extension of a Type II phase correction is to allow a delay time before the correction gradient is applied. Events such as spin echoes may be observed during this delay time. Such a phase correction wherein an opposite polarity gradient is applied after a delay time will be referred to as a Type III phase correction. A further type of phase correction (Type IV) is similar to a type III correction, except that a 180° RF pulse is applied to the volume of interest during the period between the application of the original and correction gradients, such that the polarity of the correction gradient will be the same as that of the first gradient. The correction gradient has the same polarity as the first gradient because the intervening 180° RF pulse makes the phases negative.

SUMMARY OF THE INVENTION

The present invention is directed to a method of selective irradiation imaging wherein direct analysis of the spin echo (as opposed to analysis of the FID) provides for rapid sequential scanning of plural planes (planar volumes) within the object. A predetermined number of parallel planes are sequentially selectively excited such that the spins of the atoms (nuclei) disposed therein are reoriented by approximately 90°. A predetermined number of transverse planes within the object are then selectively excited to reorient the spins of the atoms therein by 180°. The nuclei disposed in the respective intersections of the 90° reoriented planes and 180° reoriented planes subsequently produce spin echo signals at times in accordance with the rule of equal times. The spin echo signals are thus generated during a sequence of respective time periods. By measuring the spin echoes in the presence of a position variant magnetic field along the line of intersection, the spin densities of unit volumes within each individual intersection can be provided by Fourier transforming the respective spin echo signals.

However, if the sets of repeated read outs of a particular line occur too often $T_1$ effects will decrease the signal strength from the unit volumes. Thus the signal strength indicates the combined effects of spin density and $T_1$. Volume elements with long $T_1$s would have lower than normal "apparent" spin densities. Volume elements with short $T_1$s will show very little change from their true spin density. Therefore, it is necessary to wait until a particular line to be read out is fully relaxed. After five $T_1$, relaxation has occurred to the extent of 99.3%. It is possible to use this $T_1$ effect on the spin echo to produce $T_1$ images by varying the repetition rates of repeated read outs. One can also use a "fast" repetition rate to enhance the image contrast between tissues with similar nuclear densities but different $T_1$s. Incidentally, by varying $\tau$, the spin echo signal can be effected to produce $T_2$ images. One can use varying $\tau$ periods to enhance the image contrast between tissues with similar nuclear densities but different $T_2$s.

When the spin echo is preferably independent of $T_1$, it is desirable to delay reading out a line until it has fully relaxed. However, this greatly delays the time necessary to develop a full image.

To speed the process, a number of transverse planes may be reoriented in one procedure by applying a number of 90° pulses and 180° pulses, and then reading out all of the spin echoes as they occur after application of all of the 180° pulses. However, the time between application of the 90° pulse and 180° pulse for any given line must be less than the spin-spin relaxation time (related to $T_2$). After relaxation, no spin echo can be obtained. In some samples, the spin-spin relaxation time is very short so that it is difficult, if not impossible, to apply a large number of 90° and 180° pulses. For such objects, it is necessary to repeat the 90° pulse-180° pulse-read out sequence a large number of times, thus slowing the time necessary to develop an image, particularly since a particular line must be fully relaxed (in the spin-lattice sense) prior to reorientation.

To hasten the development of an image in the present invention, a 90° RF pulse and a 180° RF pulse are applied to a sample to generate a spin echo from a particular line in the same manner as described above. While the planes which have been excited are relaxing, other lines are read out by applying 90° RF pulses and 180° RF pulses to other planes. To eliminate the above-described $T_1$ effects, these lines to be read out do not lie within any of the previously excited planes. After a number of additional lines have been read out, the first planes that had been excited will be relaxed and another line in one of those planes can be read out by re-exciting one of the first planes and a transverse plane which intersects the first plane in the line to be read out.

If a planar image is desired, the planes to be excited to read out lines of the planar image can be selected transverse to the plane of the image. In this manner, additional lines in the desired image plane can be read out while previously excited lines relax.

To eliminate the interference of the FID with the spin echo signal, the phases of the 90° and 180° RF pulses can be changed. By changing the phase of the pulses, the FID and/or the spin echo signal can be inverted. By scanning a line of plurality of times, with RF pulses having different phases, particular arithmetic combinations of corresponding portions of the spin echo signals will cause the FID components of the spin echo signal to cancel, or subtract out, while the actual spin echo will not cancel out. Thus, the result of any of the arithmetic combinations will be a signal related solely to the spin echo so that the relative density of nuclei in the line that is read out can be determined without interference from the FID.

BRIEF DESCRIPTION OF THE DRAWINGS

These and other objects and advantages of the invention will become more apparent and more readily appreciated from the following detailed description of the presently preferred exemplary embodiment of the invention, taken in conjunction with the accompanying drawings, of which:

FIGS. 1A through 1E are pictorial schematics of the reorientation of nuclear moments in response to an RF pulse;

FIG. 6 is a diagram illustrating a two-line spin scanning sequence;

DETAILED DESCRIPTION OF PREFERRED EXEMPLARY EMBODIMENTS

Referring now to FIGS. 2A–2D and 3, a spin echo scanning sequence in accordance with the present invention will be described for determining the normal, $T_1$ modified or $T_2$ modified density of nuclear spins (hereinafter termed the "spin density") in a unit volume 102 within an object 100. Suitable apparatus for practicing such spin echo scanning sequence will hereinafter be described in conjunction with FIGS. 15A, 15B, 16 and 17.

The first step in the spin echo scanning sequence, as in the other NMR imaging techniques, is to provide initial alignment of nuclear spins in object 100. To this end, an intense magnetic field, $B_0$, is generated along, for example, the Z direction of a nominal Cartesian coordinate system centered in alignment with object 100 (FIG. 2A). As noted above, the nuclear spins of the atoms assume Larmor frequencies directly proportional to the magnetic field acting thereon, and tend to align with magnetic field $B_0$.

Next, a particular volume within object 100 is excited to nutate the spins of the atoms in the volume to a transverse orientation, preferably 90°. It should be recalled that nuclei with spins at a given Larmor frequency are responsive only to external electromagnetic signals substantially at the Larmor frequency. Thus, if object 100 is subjected to a position variant magnetic field, such as, for example, a magnetic gradient along the X direction ($g_x = \delta B_z/\delta x$) the nuclei located within the various Y-Z planes (planar volumes) located at different positions along the X axis will have different Larmor frequencies. A single Y-Z plane can thus be addressed by irradiating object 100 (while in the presence of the X position variant field) with an electromagnetic signal having a frequency spectrum corresponding to the plane. In practice, of course, the addressed volume of atoms have a finite X dimension, and accordingly, include spins of Larmor frequencies over a predetermined bandwidth.

Thus, after initial alignment of the spins by field $B_0$, an X-variant magnetic field, suitably a gradient $g_x$ (FIG. 3), is generated across object 100, to provide a Larmor frequency discriminant along the X axis. In the presence of gradient $g_x$, a particular planar volume 104 (FIG. 2B) within object 100 is addressed by irradiating object 100 with a 90° electromagnetic pulse X having a frequency spectrum consisting substantially of frequency components corresponding to the Larmor frequencies of the atoms disposed within plane (planar volume) 104.

Figure 3:
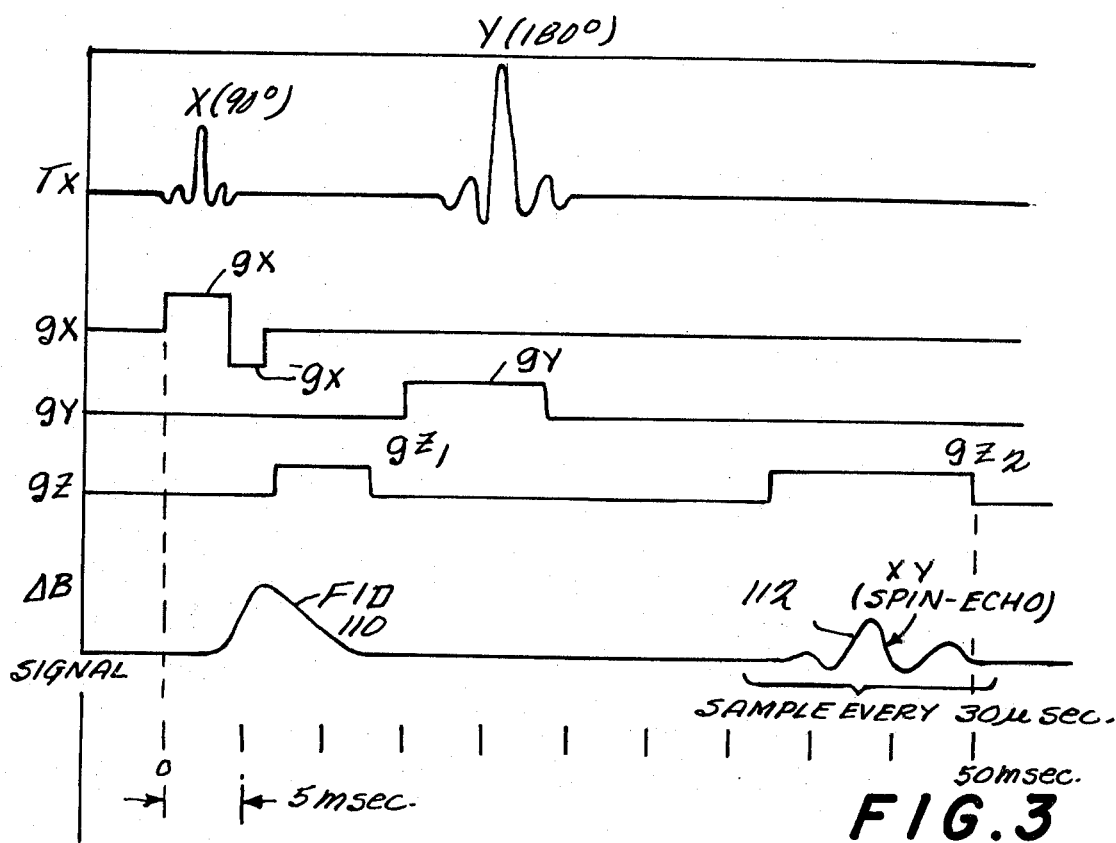
FIG. 3 is a diagram illustrating the selective spin echo sequence of FIG. 2.

The relationship of 90° pulse X and gradient $g_x$ is shown in FIG. 3. It should be noted that FIG. 3 (and FIG. 6) depicts the presence or absence of the gradient, rather than the shape or form of the gradient itself.

To simplify the following discussion, the following conventions will be adopted. The process of irradiating the object with an electromagnetic signal of predetermined frequency spectrum in the presence of a position variant field to excite a predetermined volume of nuclei will hereinafter be referred to as a process of selective irradiation. Similarly, planar volumes wherein the nuclear spins are reoriented by 90° or 180° will hereinafter be referred to as 90° planes and 180° planes, respectively.

As previously noted, the nuclear spins within volume 104 are, after 90° pulse X and Type I phase correction $-g_x$, initially in alignment and at 90° with respect to the original orientation and thus induce a relatively strong voltage in a coil disposed about the X axis. However, the induced voltage decays with time as the phases of the spins at different positions within volume 104 spread. Free induction decay (FID) signal 110 generated by the nuclei within volume 104 as a result of 90° pulse X is shown in FIG. 3.

Now a Type IV phase correction is applied by the gradient $g_{z1}$. This gradient is applied to spread the phases along the z direction so that they may be refocused by $g_{z2}$ during the first half of the spin echo read out. $g_{z1}$ has the same area as the first half of $g_{z2}$. FIG. 3 shows $g_{z1}$ not overlapping any other gradient for simplicity in presenting the FID. It is possible to have $g_{z1}$ overlap $-g_x$ with no deleterious effect of the spin echo and a reduction in the time required for the sequence.

The next step in the spin echo scanning sequence is to effect a 180° rotation of nuclear spins within a volume transverse to and intersecting volume 104 such that unit volume 102 is common to both volumes. A Y-position variant magnetic field, suitably a gradient $g_y = \delta B_z/\delta y$ is therefore generated across object 100, and a predetermined X-Z planar volume 106 (FIG. 2C) is excited by a 180° pulse Y having a frequency spectrum corresponding to the band of Larmor frequencies of the nuclei within volume 106. Thus, the phases of the spins of the nuclei within volume 106 are reversed and volume 106 becomes a 180° plane.

The effect of the phase reversal on those nuclei common to both planes 104 and 106 (hereinafter referred to as intersection volume 108, FIG. 2D) is to recluster the spin phases. Thus, spin echo 112 (FIG. 3) is produced by intersection volume 108.

Figure 2:
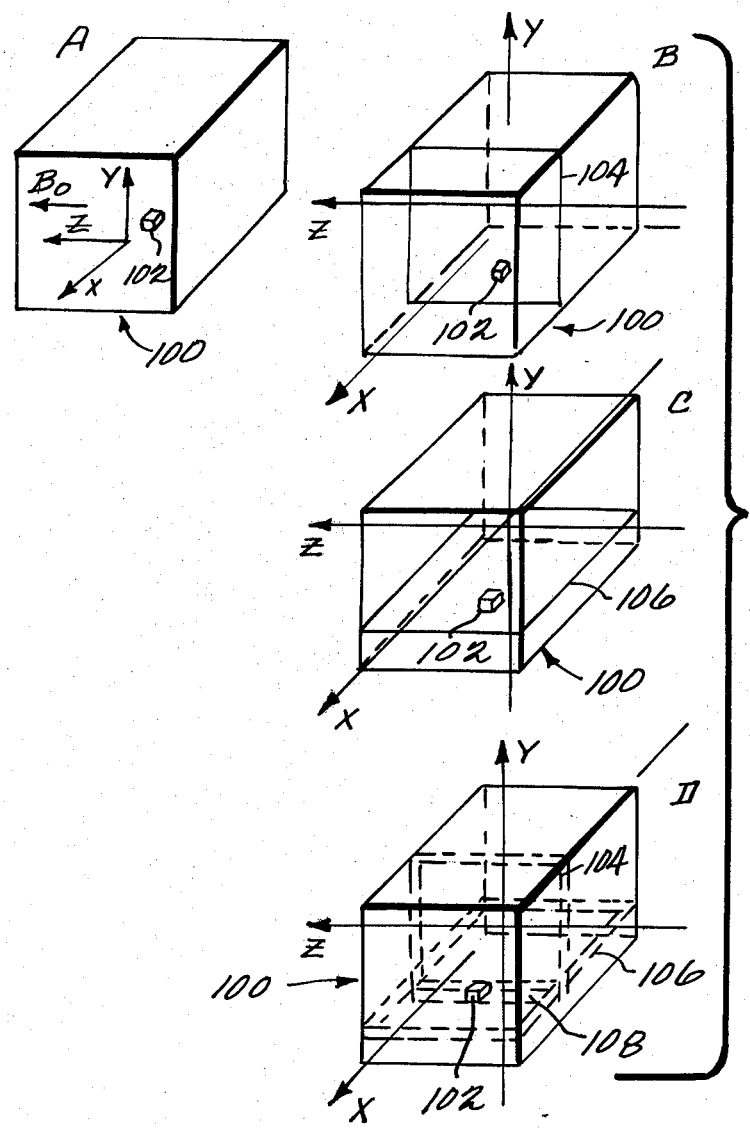
FIGS. 2A through 2D are pictorial schematics of an object subjected to one line scanning spin echo sequences in accordance with the present invention.
Figure 4:
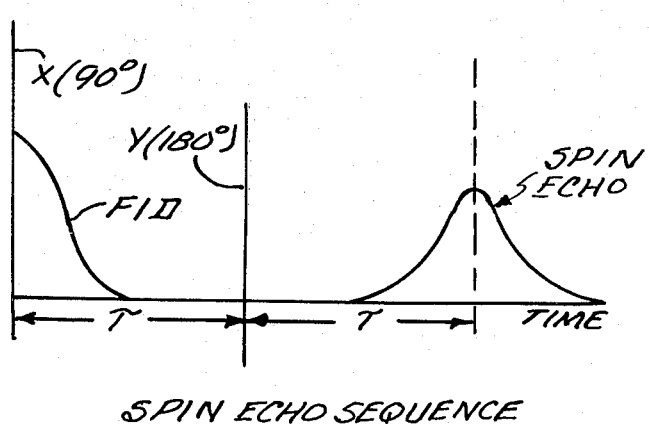
FIG. 4 is a schematic illustration of the spin echo sequence of FIGS. 2A through 2D and 3.

Referring briefly to FIG. 4, it should be noted that 180° pulse Y acts, in effect, as a mirror with respect to FID 110. As the phases begin to regroup, a reflection of the decay is provided and a peak signal is generated at a time $2\tau$, where $\tau$ is equal to the time between the generation of 90° pulse X and 180° pulse Y, in accordance with the rule of equal times. The phases of the spins thereafter spread and the spin echo decays in a manner similar to the decay of the FID. As will hereinafter be explained, the rule of equal times can be utilized in a multiline scan system to provide non-interfering spin echoes from the multiple lines. Further, while the spin echo is of less magnitude than the FID due to transverse relaxation ($T_2$) the mirroring effect provides twice the sampling period for collecting the data. Also the spin echo is a reflection only of that part of the FID arising from the nuclei in volume 108.

The spin echo is recorded in the presence of a position variant magnetic field wherein the intensity of the magnetic field varies as a function of position along the line of intersection. Referring again to FIGS. 2 and 3, the individual spin densities of unit volumes within intersection volume 108 are determined by subjecting object 100 to a Z-position variant magnetic field, suitably gradient $g_{z2} = \delta B_z/\delta z$ (FIG. 3) during the time period when spin echo 112 is generated. The spin echo signal is sampled and a Fourier transform of the sampled spin echo signal is performed to, in effect, measure the intensity of the various frequency components of the spin echo. The spin density of the particular unit volume 102 is thus represented by the intensity of the spin echo frequency component corresponding to the particular Larmor frequency of the unit volume.

If the gradient $g_{z2}$ is such that its contribution to $B_z$ is zero at the center of intersection volume 108, unit volumes at equal Z distances on either side of the center will have Larmor frequencies at equal frequency increments above and below the center Larmor frequency. The demodulated signal components from those unit volumes will be at equal and opposite frequencies and can thus be discriminated by conventional quadrature detection techniques, as will be described.

Figure 5:
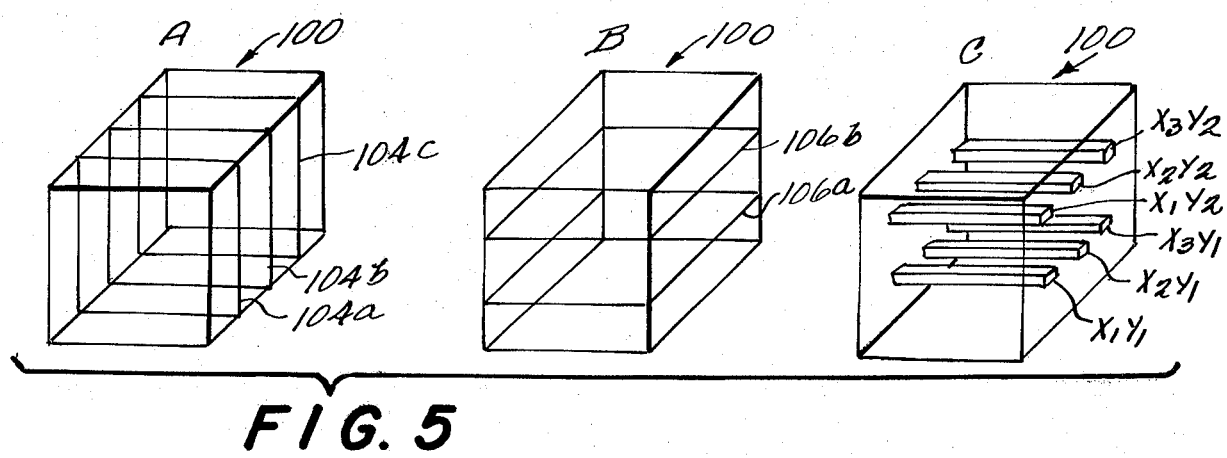
FIGS. 5A–5C are pictorial schematics of an object subjected to a multi-line spin echo scanning sequence.

The spin echo scanning sequence just described is particularly advantageous in that it is readily adapted for rapid multi-line scanning. By selectively addressing a sequence of respective planes with 90° pulses, then sequentially addressing selected transverse planes with 180° pulses, a timed sequence of spin echoes from plural lines of intersection can be effected. The aforementioned rule of equal times provides a time discrimination between the respective spin echoes. By way of example, a two line sequence will now be explained with reference to FIGS. 5 and 6.

As in the single-line scanning sequence, a first plane 104a (FIG. 5A) is addressed by selective irradiation, suitably utilizating a 90° pulse $X_1$ in cooperation with an X-gradient $g_x$ (FIG. 6). Thereafter, successive selective irradiation processes are performed to cause phase reversals in transverse planes 106a and 106b (FIG. 5B). As shown in FIG. 6, a Y-position variant magnetic field, suitably a gradient $g_{y1}$, is generated across object 100 and a 180° pulse $Y_1$ of appropriate frequency spectrum, is applied to selectively excite volume 106a to 180°. A second X-Z plane 106b is excited by a selective irradiation process utilizing a second 180° pulse $Y_2$ and Y-gradient $g_{y2}$ in predetermined time relation with pulses $X_1$ and $Y_1$. X-Z plane 106b is selected at a Y position different from that of plane 106a by suitably offsetting the frequency spectrum of 180° pulse $Y_2$ by a suitable frequency $\Delta F$, changing the main magnetic field $B_0$ by a predetermined amount $\Delta B$ (the shift $\Delta B$ effecting a shift in relative Larmor frequency throughout the object) or by a combination of both. The $\Delta B$ method is schematically illustrated in FIG. 6.

The nuclei common to both the 90° plane and 180° plane, i.e., intersection volumes $X_1Y_1$ and $X_1Y_2$ (FIG. 5C) generate respective spin echoes (also designated $X_1Y_1$ and $X_1Y_2$ in FIG. 6) at respective times in accordance with the rule of equal times. The respective spin echoes are recorded in the presence of position variant magnetic fields, gradients $g_{z1}$ and $g_{z2}$ (FIG. 6), respectively, to impart a Larmor frequency discriminant along the line of intersection. Fourier transforms are taken of the recorded spin echoes to develop indicia of the spin-densities, or $T_1$ or $T_2$ modified spin densities of unit volumes within the intersection volumes.

It should be noted that the respective spin echoes $X_1Y_1$ and $X_1Y_2$ occur at time periods after pulse $Y_1$ and after $Y_2$, respectively, equal to the time periods between pulses $Y_1$ and $X_1$ and pulses $Y_2$ and $X_1$. Thus, by proper relative timing of pulses $Y_1$ and $Y_2$ spin echoes $X_1Y_1$ and $X_1Y_2$ can be made to occur with a desired time interval therebetween to provide proper discrimination between lines.

The spin phases of nuclei other than in the respective instantaneously selected planes are spread by exposure to the respective magnetic gradients. Spurious phase spreading due to the gradients and steps in magnetic field $\Delta B$ is corrected by application of the various types of phase corrections. For example, with reference to FIG. 6, gradient $-g_x$ is the Type I phase correction required following a 90° selective irradiation. The gradient $g_{y1}$ causes phase spreading in 180° plane 106b prior to pulse $Y_2$ and gradient $g_{y2}$ causes phase spreading in 180° plane 106a after pulse $Y_1$. Correction should be made for such spurious phase spreading prior to the generation of a spin echo signal from nuclei within the affected plane. Accordingly, to avoid errors due to spurious phase spreading in spin echo $X_1Y_1$ a Type II negative gradient $-g_{y2}$ is applied immediately upon termination of gradient $g_{y2}$. However, negative gradient $-g_{y2}$ affects plane 106b after pulse $Y_2$ and must itself be corrected. Correction for the effects of gradients $g_{y1}$ and $-g_{y2}$ on plane 106b and thus echo $X_1Y_2$ is provided by application of Type IV correction gradient $g_{y3}$ and gradient correction Type III $g_{y4}$, respectively. The first half of read out gradient $g_{z1}$ must refocus spin phases to produce an echo. This requires that the spins be defocused at the start of the sequence. Gradient $g_{z0}$ does this. The area of gradient $g_{z0}$ is half that of $g_{z1}$ such that the refocusing is complete at the center of the echo. The first half of $g_{z1}$ is, in effect, a Type IV phase correction for $g_{z0}$. $g_{z0}$ may be applied at the same time as $-g_x$.

Phase spreading effects of the second half of gradient $g_{z1}$ on plane 106b are corrected by application of negative gradient $-g_{z1}$ (a Type II phase correction). The spin echo is refocused during this correction and samples taken during this period can be used in signal averaging.

Figure 7:
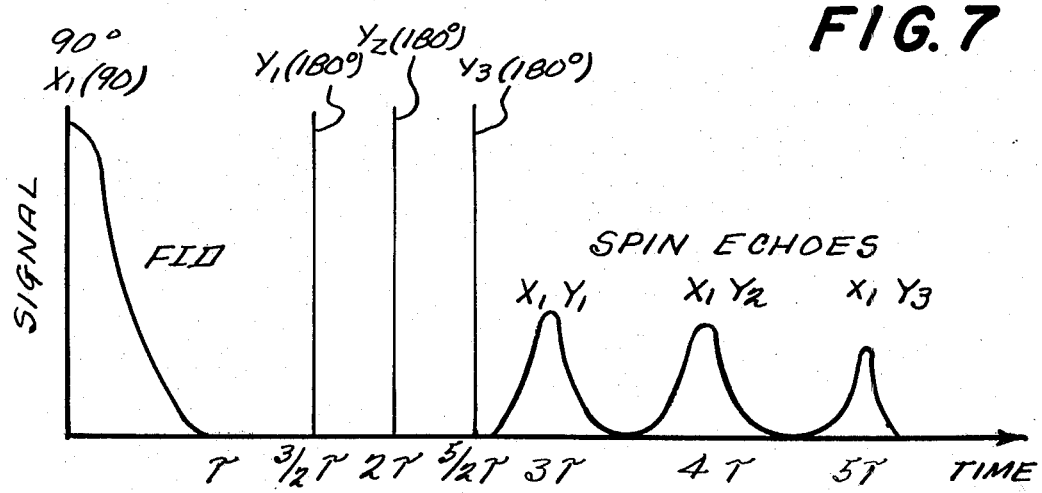
FIGS. 7 and 8 are schematic graphs of further multi-line spin echo sequences in accordance with the present invention.

FIG. 7 schematically illustrates a three line spin echo scanning sequence. A 90° pulse $X_1$ is applied at time $t_0$ (in the presence of an X gradient) and a sequence of Y pulses (in the presence of Y gradients) irradiate the object at times $3\tau/2, 2\tau$ and $5\tau/2$, respectively. Accordingly, a spin echo $X_1Y_1$ is generated at a time $3\tau$ by the nuclei disposed common to both the 90° plane associated with pulse $X_1$ and the 180° plane associated with pulse $Y_1$. Similarly, spin echoes $X_1Y_2$ and $X_1Y_3$ are generated by the nuclei common to the planes associated with pulses $X_1$ and $Y_2$, and pulses $X_1$ and $Y_3$, at times $4\tau$ and $5\tau$, respectively. Phase correction (not shown) can be effected in a manner similar to that described in conjunction with FIG. 6. The spin echoes are recorded in the presence of a Z gradient and Fourier transforms are performed to develop indicia of the relative normal, or $T_1$ or $T_2$ modified spin densities.

Figure 8:
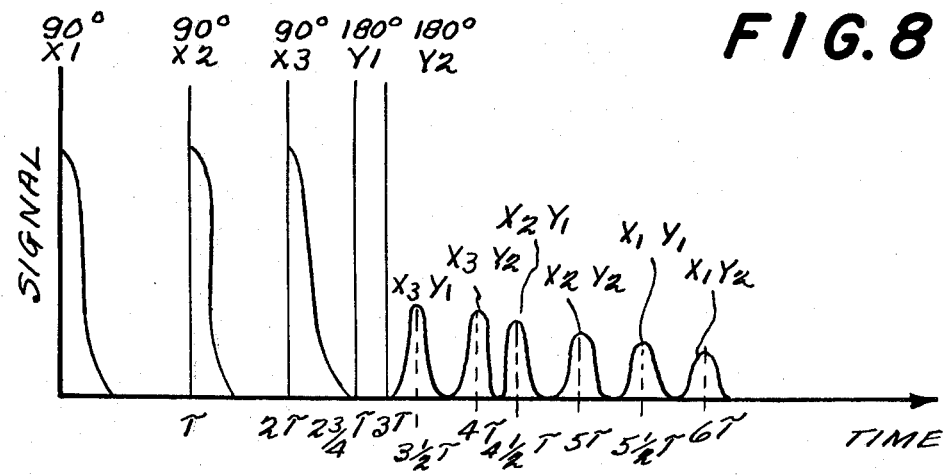

As schematically illustrated in FIG. 8, a plurality of Y-Z planes can be sequentially excited in cooperation with one or more X-Z planes to produce a multi-line scan. For example, assume Y-Z planes 104a, 104b and 104c (FIG. 5A) are excited to 90° orientations by a selective irradiation process including irradiation of the object by successive 90° pulses $X_1$, $X_2$ and $X_3$ in the presence of X gradients. As noted above, the planes along the X axis (and Y axis) are uniquely selected by choosing appropriate frequency spectrums for the respective 90° pulses, by offsetting the magnetic field $B_0$, or by a combination of both techniques. After Y-Z planes 104a, 104b and 104c are excited to 90°, selected X-Z planes 106a and 106b are excited to 180° by a similar process of selective irradiation utilizing 180° pulses $Y_1$ and $Y_2$. The intersections of the respective Y-Z planes and X-Z planes result in a plurality of lines of intersection as shown in FIG. 5C, $X_1Y_1$, $X_2Y_1$, $X_3Y_1$, $X_1Y_2$, $X_2Y_2$ and $X_3Y_2$. Each such line of intersection generates a spin echo signal denoted in FIG. 8 by the respective associated line of intersection in accordance with the aforementioned rule of equal times.

By proper choice of the time intervals between respective pulses, the respective spin echoes are generated in a non-interfering sequence. For example, assuming 90° pulses $X_1$, $X_2$ and $X_3$ to be generated at times 0, $\tau$ and $2\tau$, respectively, and 180° pulses $Y_1$ and $Y_2$ generated at $11\tau/4$ and $3\tau$, respectively, the spin echo from the line of intersection $X_3Y_1$ will be generated at time $7\tau/2$; $X_3Y_2$ at time $4\tau$; $X_2Y_1$ at $9\tau/2$; $X_2Y_2$ at $5\tau$; $X_1Y_1$ at $11\tau/2$; and $X_1Y_2$ at time $6\tau$. Correction for phase spreading due to the effects of the respective gradients would again be made in a manner similar to that described above with respect to FIG. 6. The respective spin echoes are then recorded in the presence of a Z gradient and Fourier transforms performed to develop indicia of the normal, $T_1$ modified or $T_2$ modified spin densities of the individual unit volumes within the lines of intersection. Thus, utilizing a spin echo sequence in accordance with the present invention, a multiplicity of lines within volume 100 can be scanned in rapid sequence, at rates not limited by the spin-lattice relaxation time $T_1$ of the object as in scanning techniques using saturation.

Figure 9:
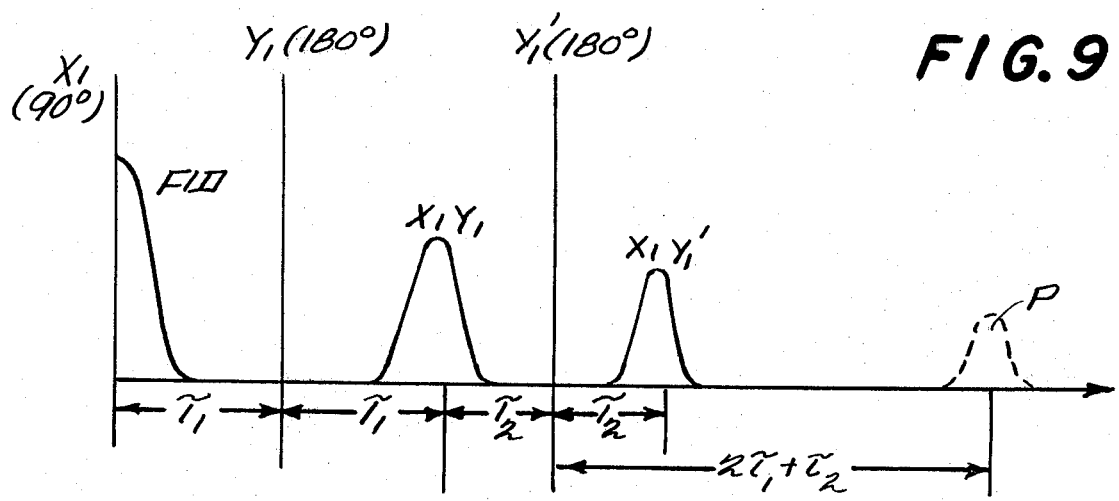
FIGS. 9, 10 and 11 are schematic graphs illustrating spin echo scanning sequences in accordance with the present invention, employing copying.

In some instances, it is desirable to take plural readings of the spin echo from a given line of intersection for signal averaging purposes. As noted above, Mansfield and Maudsley have indicated that after the FID has decayed, various signal refocusing arrangements can be employed to recall the signal for signal averaging purposes. A similar process may be employed to recall the spin echo signal. Referring now to FIG. 9, a spin echo $X_1Y_1$ is generated by first selectively irradiating a first plane (planar volume) with a 90° pulse $X_1$, and thereafter selectively irradiating a transverse plane with a 180° pulse $Y_1$. Assuming the time interval between pulse $X_1$ and $Y_1$ to be equal to $\tau_1$, spin echo $X_1Y_1$ is generated with a peak at a time $\tau_1$ after the irradiation of 180° pulse $Y_1$, in accordance with the rule of equal times. If a further 180° pulse $Y_1'$ having a frequency spectrum including that of pulse $Y_1$ is generated at a time $\tau_2$ after the peak of spin echo $X_1Y_1$, the phases of the nuclear spins generating spin echo $X_1Y_1$ will be reversed, causing the phases to converge and thereby create a copy or replica $X_1Y_1'$ of spin echo $X_1Y_1$.

The rule of equal time applies to the phenomenon of copying. Accordingly, replica $X_1Y_1'$ occurs at a time $\tau_2$ after the generation of 180° pulse $Y_1'$. Further replicas can be generated by applications of additional 180° pulses. However, the overall amplitudes of the signals decrease in accordance with the transverse relaxation time $T_2$. Such decay represents a practical limit on the number of replicas that can be produced.

It should be appreciated that if 180° pulse $Y_1'$ includes spectral components not in pulse $Y_1$, a phase reversal will be effected of portions of the original 90° plane not affected by pulse $Y_1$. Thus, such portions of the original 90° plane will produce a parasitic spin echo P at a time $2\tau_1 + \tau_2$ after the generation of pulse $Y_1'$. The parasitic echo P can be avoided by making the frequency spectrum of 180° pulse $Y_1'$ identical to that of pulse $Y_1$.

Figure 10:
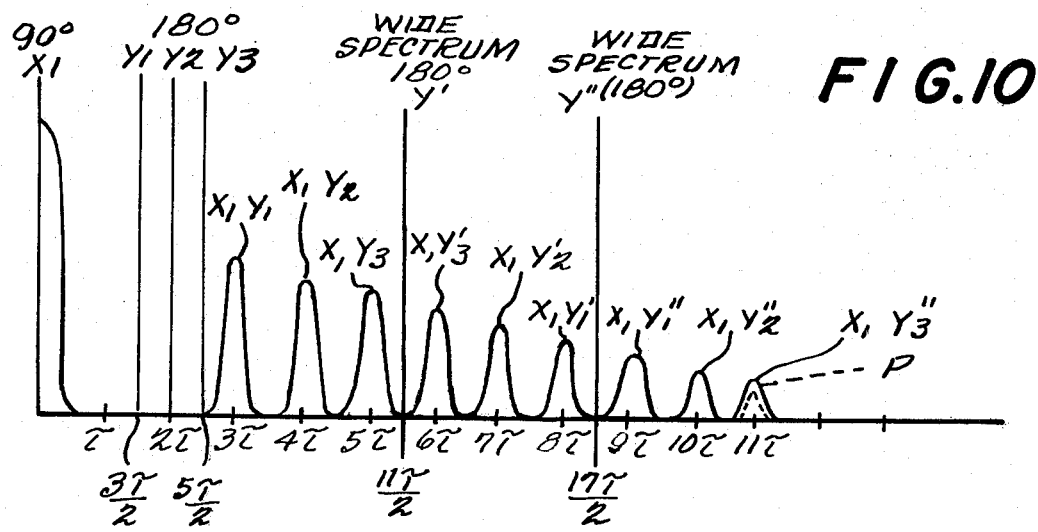
Figure 11:
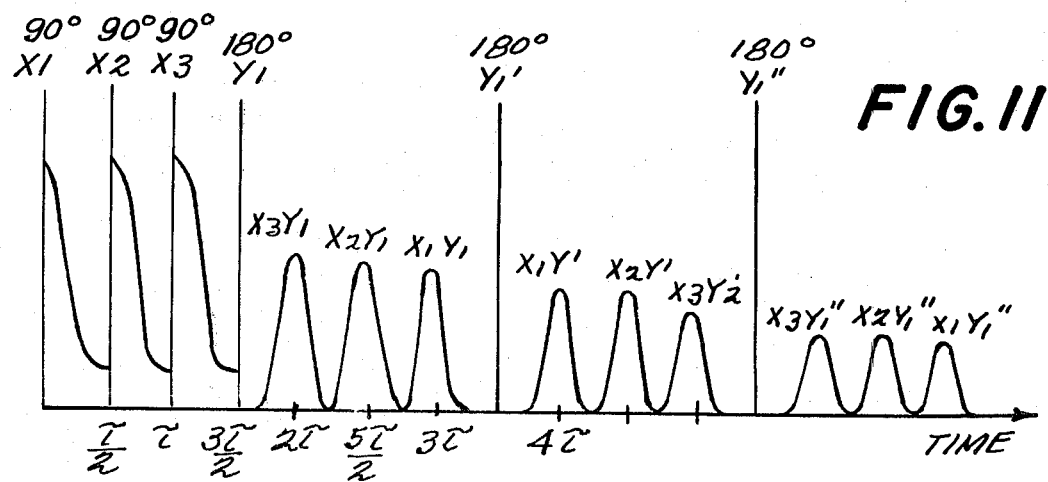

Replicas of a plurality of spin echoes can be generated by application of a single 180° pulse having a frequency spectrum encompassing the individual frequency spectra of the original 180° pulses, i.e., covering the respective 180° planes. Such a procedure is schematically illustrated in FIGS. 10 and 11. In FIG. 10, a first plane is selectively irradiated by 90° pulse $X_1$, then respective transverse planes are selectively irradiated in sequence by 180° pulses $Y_1$, $Y_2$ and $Y_3$, respectively, applied at times $3\tau/2$, $2\tau$ and $5\tau/2$. Accordingly, spin echoes from the respective lines of intersection $X_1Y_1$, $X_1Y_2$ and $X_1Y_3$ are generated at times $3\tau$, $4\tau$ and $5\tau$, respectively.

Application of a wide spectrum 180° pulse Y' at, for example, time $11\tau/2$, will generate replicas of the spin echoes in reverse order. In accordance with the rule of equal times, replica $X_1Y_3'$ is generated at a time $6\tau(\tau/2$ after the application of pulse Y', an interval equal to the time between the occurrence of spin echo $X_1Y_3$ at $5\tau$ and pulse Y'). Similarly, replica $X_1Y_2'$ occurs at time $7\tau$ and replica $X_1Y_1'$ occurs at time $8\tau$.

Application of a second wide spectrum 180° pulse Y" at, for example, time $17\tau/2$ will create further replicas of the spin echoes, this time in the same order as the original spin echoes. Replicas $X_1Y_1''$, $X_1Y_2''$ and $X_1Y_3''$, respectively, occur at times $9\tau$, $10\tau$ and $11\tau$.

It should be noted, however, that wide spectrum 180° pulse Y' causes phase reversals in portions of the 90° plane not phase reversed by pulse $Y_1$, and accordingly, a parasitic spin echo P is generated. In accordance with the rule of equal times, such parasitic echo is generated at a time $11\tau$. Thus, parasitic echo P renders replica $Y_3X_1'$ substantially useless.

The parasitic echo can be reduced by reducing the portions of the 90° plane not phase reversed by pulse $Y_1$. The effects of the parasitic echoes can also be lessened or spread between various of the replicas by changing the relative timings of wide spectrum 180° pulses Y' and Y".

FIG. 11 shows an alternate spin echo scanning sequence utilizing copying. In this instance, a plurality of 90° planes are generated by selective irradiation with respective 90° pulses $X_1$, $X_2$ and $X_3$, followed by a 180° pulse $Y_1$ of predetermined frequency spectrum. The resultant lines of intersection generate respective spin echoes $X_3Y_1$, $X_2Y_1$ and $X_1Y_1$ in accordance with the rule of equal times. Thereafter copying is effected by selective irradiation employing respective 180° pulses $Y_1'$ and $Y_1''$ of identical frequency spectrum to pulse $Y_1$. It should be appreciated that since the frequency spectrum of the respective 180° pulses are identical, no parasitic echoes are generated.

It is possible that FID 110 following a selective 90° RF pulse will interfere with the following spin echo 112 emanating from an intersection volume 108. This type of interference can be eliminated during signal averaging. Consider a single line scan as illustrated in FIG. 3. If $g_y$ is zero and no 180° RF pulse is applied, FID 110 may last through the time when spin echo 112 occurs. Furthermore, the $g_{z2}$ gradient reclusters the FID to increase the interference. Under these conditions, FID 110, produced by spins in the entire X-plane selected by the 90° RF pulse, produces a signal during the spin echo time that is quite strong.

During the actual imaging process the strength of the FID is substantially reduced by the phase spreading produced by the gradient pulses $g_{z1}$ and $g_y$. In portions of the X selected plane it is possible for phase spreading produced by $g_{z1}$ to be compensated for by phase spreading due to $g_y$. As usual the phase spreading is a function of the area of the gradient pulse. If $g_{z1}$ is on for $t_1$ seconds and $g_y$ is on for $t_2$ seconds, then at the end of the $g_y$ pulse the phase spread for each point in the X selected plane, except for where it intersects the Y selected plane is $\theta = g_{z1} z t_1 + g_y Y t_2$.

The portions of the plane which experience no net phase spreading at the start of the echo can be found by setting $\theta = 0$.

This gives $z = -(g_y t_2/g_{z1} t_1)y$, a diagonal line through the X selected plane. Thus spins around this diagonal line will produce an interference signal during the spin echo. This interference signal is dependent only on the values of the gradient pulses and the distribution of the object in the X selected plane.

To remove this interference signal, the phases of the 90° and 180° RF pulses can be changed so that FID 110 can be inverted while spin echo 112 is not. Phase in this case is defined with respect to the output of a master oscillator 166 (described below) employed in both the generation of the RF pulses and detection of the resulting FID and spin echo signals. When the phases of the 90° pulses and the 180° pulses are 0° with respect to the output of frequency synthesizer 168, the apparatus to be described below produces an FID having a positive polarity and a spin echo having a negative polarity. The effect of FID 110 can be eliminated by scanning intersection volume 108 twice, once producing a positive FID and spin echo and once producing a negative FID and a positive spin echo, and adding the corresponding portions of the two signals together. The positive and negative interference from the FIDs will cancel when added, leaving the spin echo.

For example, if in a first read out, the phase of the 90° RF pulse is 0° and the phase of the 180° RF pulse is 90°, the polarity of both FID 110 and spin echo 112 will be positive. If, in a second read out, the phase of the 90° RF pulse is 180° and the phase of the 180° RF pulse is 0° the polarity of the FID signal 110 will be negative while the polarity of spin echo 112 will be positive. When corresponding portions of the signals from the two read outs are added, the effects of FID 110 cancel leaving only the effects of spin echo 112.

Other combinations of RF signal phase can produce the same results. For example, corresponding portions of a positive FID and a negative spin echo signal can be subtracted from a positive FID and a positive spin echo signal. Note that the repetition of line scans would usually be necessary to improve image contrast (signal-to-noise ratio) so that this repeated line scanning and summation does not detract from the utility of the technique.

A slight extension of this phase shifting will also correct for any FID from the Y selected plane where the value of the 180° pulse is not exactly correct. If, for example, the RF pulse was only 170° due to misalignment or RF absorption in object 100, there will be an FID from the Y plane. This FID may be either in phase or quadrature. The following Table I lists all the possible phase combinations for the 90° and 180° RF pulses which give inphase spin echoes:

TABLE I

| | Phase of 90° RF Pulse | Phase of 180° RF Pulse | Sign of spin echo | Sign of x plane FID | Sign of y plane FID |
|---|---|---|---|---|---|
| 1. | 0° | 0° | − | + | + |
| 2. | 0° | 90° | + | + | + Quad |
| 3. | 0° | 180° | − | + | − |
| 4. | 0° | 270° | + | + | − Quad |
| 5. | 180° | 0° | + | − | + |
| 6. | 180° | 90° | − | − | + Quad |
| 7. | 180° | 180° | + | − | − |
| 8. | 180° | 270° | − | − | − Quad |

Many combinations of phases with additions and/or subtractions of line scans can be derived from this table to eliminate the two different types of interference FIDs, but at least four line scans are required and the number of line scans must be a multiple of four. One possible combination would be to add the results of line scans 2, 4, 5 and 7 from Table I. Another possibility is to add the results from line scans 2 and 5, and add the results from line scans 1 and 6, and then subtract the intermediate sums. Table I can also be employed for selecting the RF phases for multi-line sequences.

If an image (particularly an image of a volume) were constructed employing the sequence of applying the 90° RF pulse, applying the 180° RF pulse, reading out the spin echo, and waiting for the excited planes to fully relax, an extraordinarily long time would be consumed. As described above, to speed the development of a volume image, a number of 90° planes and 180° planes may be excited, after which the spin echoes from all of the intersection volumes are read out. However, the 180° RF pulses must be applied within the spin-spin relaxation time (related to $T_2$) in order to produce spin echo 112. In many substances, $T_2$ is too short to make practical the scanning of more than one line at a time.

In the case where a short $T_2$ makes it impractical to scan many lines at a time, and a long $T_1$ precludes rapid repeated irradiations of a particular plane, the following process can be used to rapidly produce images, particularly multi-planar images.

Figure 12:
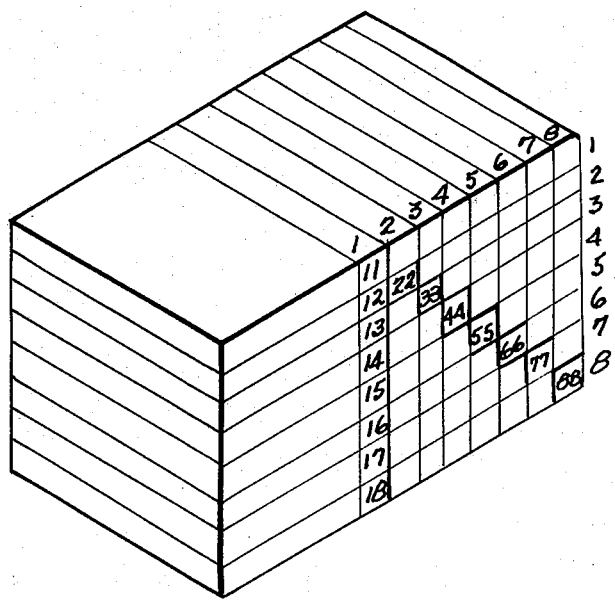
FIG. 12 is a pictorial schematic of an object subjected to a plurality of line scanning spin echo sequences in accordance with the present invention.

In FIG. 12, line 11 is defined by two selective irradiations. The planes excited by these irradiations must be allowed to relax (in the spin-lattice, $T_1$ sense) before they can be irradiated again. If reirradiation is delayed one $T_1$ unit of time, relaxation will have occurred to the extent of 63.2%. If reirradiation is delayed five $T_1$ periods, relaxation will have occurred to the extent of 99.3%. During this waiting period, it is possible to read other lines as long as these other lines do not intersect any of the previously irradiated planes. Line 22 in FIG. 12 is an example of such a line. Note that intersection volume 22 is in neither of the planes excited to produce a read out from intersection volume 11. After line 22 is read out, lines 33–88 can be sequentially scanned while the preceding planes recover. If enough intersecting volumes 11–88 are included, the planes defining intersection volume 11 have relaxed by the time intersection volume 88 has been read out. Thus, lines 11–88 can be read out again for averaging purposes, or lines 12–81 can be read out to develop an image of the volume. In the latter case, the final set of lines to be read out would be 18, 21, 32, 43 ... 87, and would complete the image of eight lines in each of eight planes.

Where the relaxation time is approximately equal to eight irradiation and sample periods, it is possible to develop images for eight planes in the time it takes to develop an image for one plane if the time between lines were spent waiting for $T_1$ type recovery. In practice, the number of planes which can be scanned depends on $T_1$, $T_2$ and the time required to select and sample a line. For example, at roughly room temperature and a magnetic field strength of 3.52 K gauss (0.352 Tesla), $T_1$ may typically be 0.5 to 1.0 seconds, while $T_2$ may be about 100 ms. In the preferred embodiment the time between the first turn on of $g_x$ and the turn off of $g_{z2}$ is 50 ms.

In practice, the borders around excited planes are not precise. To ensure that border areas are not excited in two consecutive read outs, it may also be advantageous to skip some planes. Thus, every other plane can be skipped so that the first sequence would be 11, 33, 55, 77.

Figure 13:
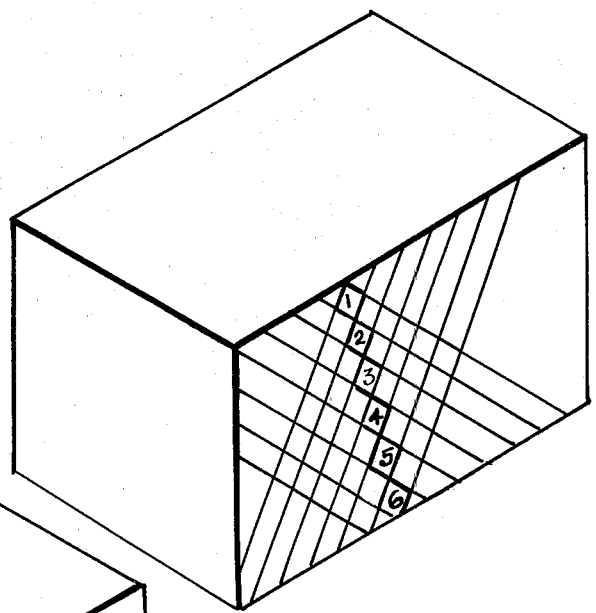
FIG. 13 is a pictorial schematic of an object subjected to a plurality of line scanning spin echo sequences in accordance with another embodiment of the present invention.

If only one plane is of interest and an unusual resolution element is acceptable, a variation of this rapid multi-plane scanning can be applied to a single plane through the object, as illustrated in FIG. 13. The selective irradiation planes are aligned at non-orthogonal angles such that they have an intersection volume with a diamond or rhombus cross-section rather than a rectangular cross-section. The slant angle of the selected planes is achieved by applying two gradients at the same time. It is possible to stack these diamond shapes along a line so that the result is a single planar image. In this manner each line being read out is not disposed in planar volumes previously excited. The volume of the planar image composed of diamonds is only half that of a planar image composed of squares having contiguous surfaces with the same resolution, so that for the same image contrast (signal-to-noise ratio) four times the number of read outs is necessary. This increased averaging requirement will reduce the advantage of avoiding $T_1$ recovery delays. For example, if $T_1$ is ten times longer than the line acquisition time, the requirement of four times more averaging increases the imaging speed by a factor of 2.5, instead of the full 10 fold increase.

Figure 14:
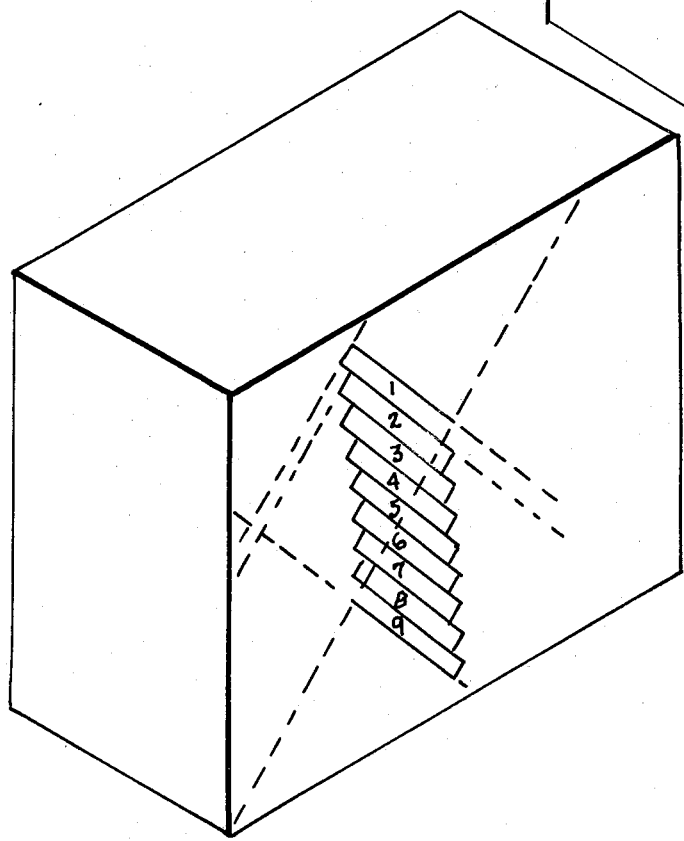
FIG. 14 is a pictorial schematic of the scanning pattern in yet another embodiment of the present invention.

An advantage can be gained in terms of the volume of the line being excited if the cross-sections are rhomboid as shown in FIG. 14. The volume of each line is now much closer to the volume of a rectangular element so that less signal averaging is required. Care must now be exercised as to the sequence in which the lines are scanned because some lines are in previously irradiated areas. For example, the irradiation which defines line 1 in FIG. 14 also irradiates parts of lines 2-8. Thus, the next line which can be scanned is line 9. To scan the entire plane, one would first do a group out of the series 1, 9, 18, 27 ... and next do a group out of the series 2, 10, 19, 28 .... The maximum speed gained would occur when the number of lines in the plane is large enough so that there are sufficient lines in each series to fully occupy the $T_1$ relaxation time with scanning.

Figure 16:
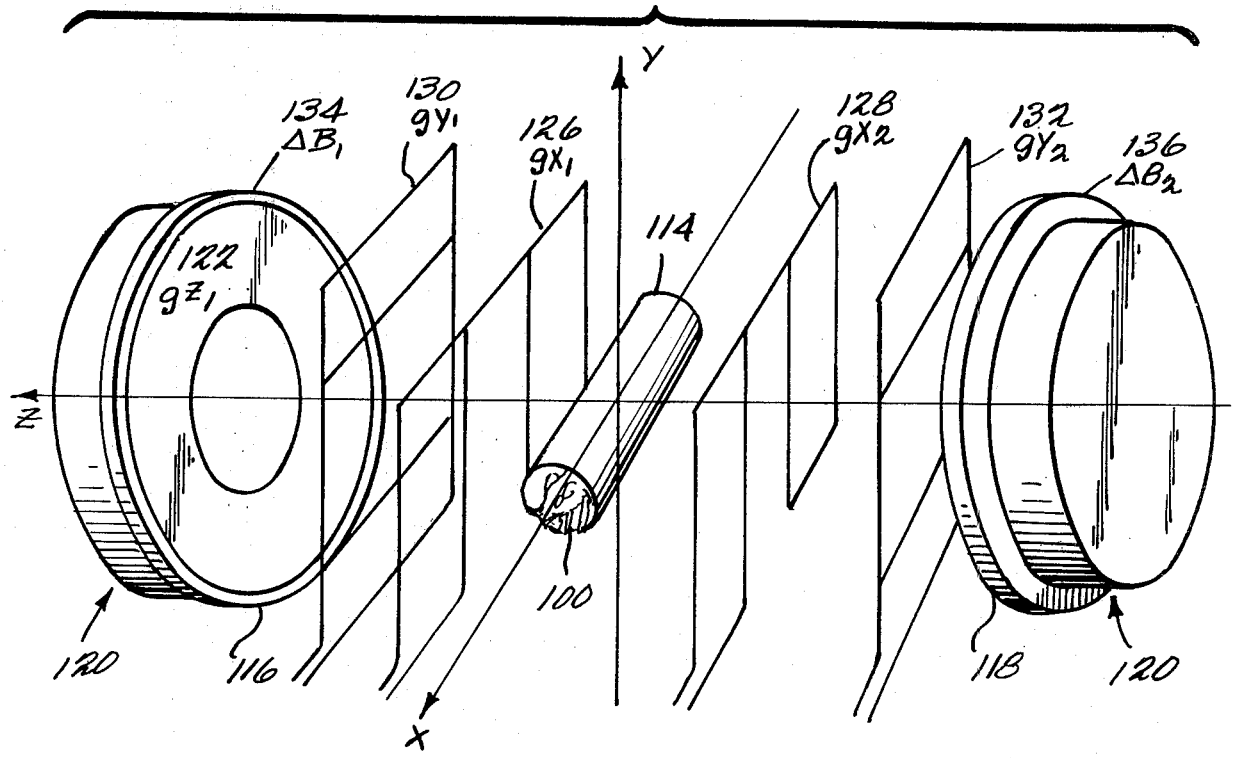
FIG. 16 is an expanded pictorial of a portion of the apparatus of FIG. 15A.
Figure 15A:
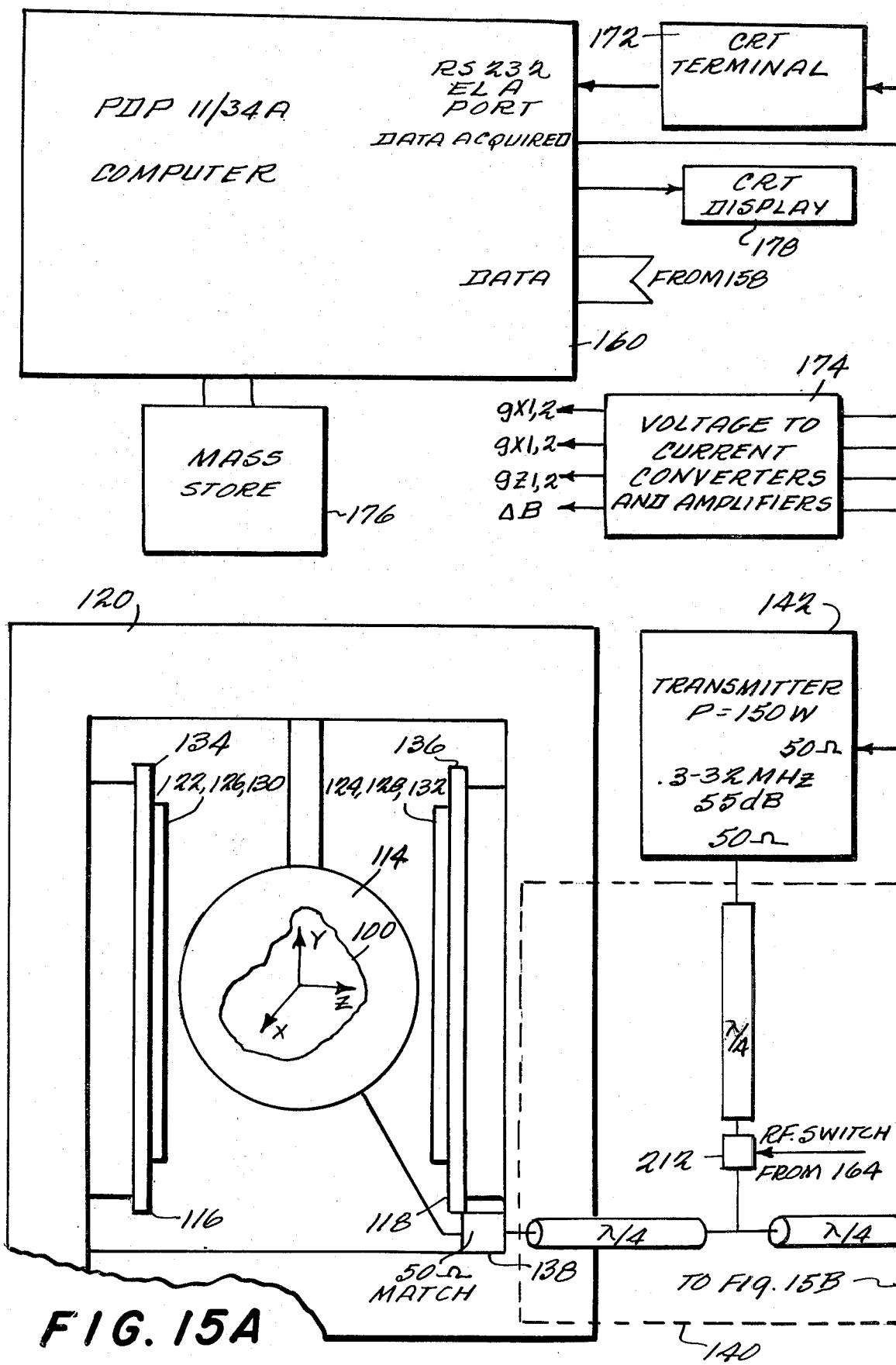
FIGS. 15A and 15B are a schematic block diagram of apparatus for effecting spin echo scanning sequences in accordance with the present invention.
Figure 15B:
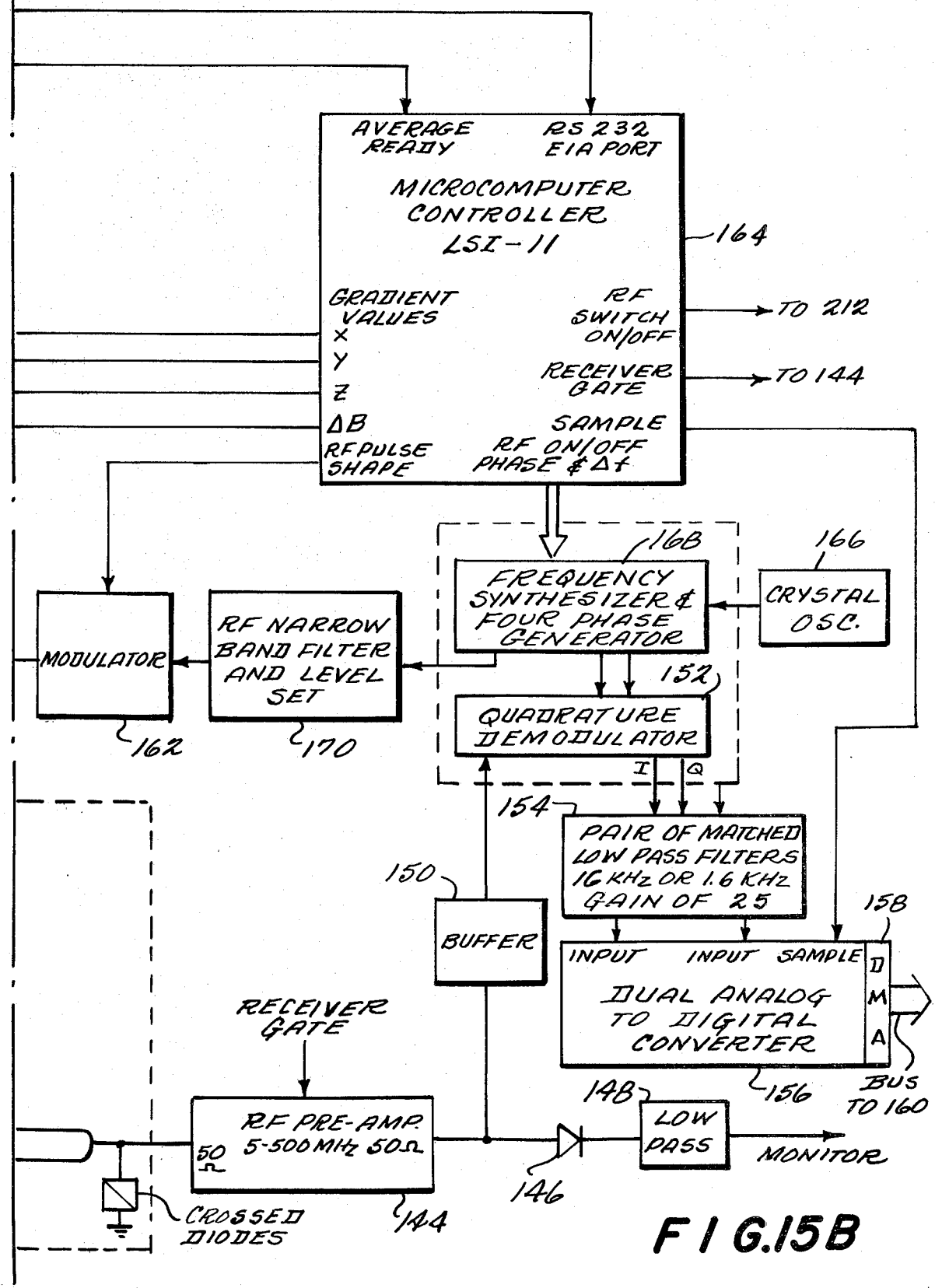

Referring now to FIGS. 15A, 15B and 16, suitable apparatus for effecting spin echo scanning sequences in accordance with the present invention will be described. FIGS. 15A and 15B show the overall apparatus in block schematic form, while apparatus utilized in generating the various magnetic fields (control circuitry excepted) is shown in exploded perspective in FIG. 16.

Object 100 is disposed within an RF coil 114 disposed about the nominal X axis of a Cartesian coordinate system. RF coil 114 is utilized in irradiation of object 100, to pick up the spin echo signals generated by object 100 and, further, suitably provides a support holder for object 100.

Coil 114 is, in turn, disposed between respective pole tips 116 and 118 of main magnet 120. Magnet 120 is utilized to generate the main magnetic field $B_0$ along the Z-direction of the nominal coordinate system (transverse to the axis of coil 114). Magnet 120 suitably comprises a conventional iron core having wound thereabout, conductors cooperating with a power supply (not shown) and are suitably water cooled to maintain a constant temperature.

Z-position variant fields are selectively provided by Z gradient coils ($g_z$) 122 and 124. Coils 122 and 124 are disposed on the respective faces of pole tips 116 and 118 and are suitably in a Maxwell coil geometry. That is, the coils are circular and concentric with the pole tip with the radius of the coils determined in accordance with the separation of the coils. Z gradient coils 122 and 124 are electrically connected in series such that the magnetic fields generated thereby are in opposition and cancel at the origin of the coordinate system.

X-position gradient magnetic fields are selectively provided by X gradient ($g_x$) coils 126 and 128. Coils 126 and 128 are suitably of a rectangular configuration disposed on pole tips 116 and 118, respectively, so as to simulate infinite conductors running in an X direction. Coils 126 and 128 are electrically connected to generate opposing magnetic fields which also cancel at the origin of the coordinate system.

Y-position variant magnetic fields are selectively provided by Y gradient ($g_y$) coils 130 and 132. Coils 130 and 132 are suitably of the same shape and area as X gradient coils 126 and 128 but are disposed on pole tips 116 and 118 in a manner to simulate infinite conductors running in the Y direction. Coils 130 and 132 are also electrically connected to generate opposing fields which cancel at the origin of the coordinate system.

Position-independent changes in main field $B_0$ can be effected, if desired, by $\Delta B$ coils 134 and 136, disposed about the outside of pole tips 116 and 118 and electrically connected in series such that they provide an additive magnetic field (with respect to each other). For further description of suitable coils for producing magnetic gradients reference is made to the aforementioned U.S. Pat. No. 4,015,196 issued Mar. 29, 1977 to Moore et al.

RF coil 114 is electrically connected through an appropriate matching impedance network 138 to one terminal of a directional network or circular (magic-T network) 140. Impedance matching network 138 suitably comprises a pair of variable capacitors for tuning RF coil 114. The variable capacitors are suitably of a non-magnetic material such as copper or brass and preferably are situated as closely as possible to RF coil 114.

Magic-T network 140 selectively couples RF coil 114 (in a mutually exclusive manner) to transmitter 142 and to a preamplifier 144. As is well known in the art, magic-T network 140 operates to connect transmitter 142 to the coil during such times that transmitter 142 is transmitting, and connects coil 114 to preamplifier 144 during such periods when transmitter 142 is not transmitting.

Preamplifier 144 is suitably of conventional type, providing a high gain and wide bandwidth. It is desirable to switch the preamplifier off during transmission or interim periods to provide greater isolation from transmitter 142. Accordingly, a gated preamplifier can be utilized. The output signals from preamplifier 144 are applied through diode detector 146 and lowpass filter 148, if desired, for monitoring during tuning of the system, and are applied through a buffer 150 to a demodulator 152.

Demodulator 152 is suitably a quadrature demodulator, so that not only frequency offset (from the center frequency, as will be explained) and amplitude information are provided, but the sign of the frequency offset can be determined as well, for relating the respective frequency components to positions in object 100 on opposite sides of the origin. Further, use of quadrature demodulation avoids phase errors due to circuit delays. Demodulator 152 is receptive of signals indicative of the transmitted signal (as well as the received signal), and generates inphase (I) and quadrature (Q) output signals (the Q output signal being at 90° phase relative to the I output signal). The I and Q output signals include components indicative of the sum and difference of the received signal frequency and the transmitted signal frequency. The spin echo signal (minus the carrier frequency) is the vector sum of the I and Q signals. A more detaled description of a suitable demodulator 152 will be made in conjunction with FIG. 17.

The I and Q demodulator output signals are applied through respective lowpass filters 154, to a two channel analog-to-digital (A/D) converter 156. A/D converter 156 is, in turn, connected through a direct memory access (DMA) interface 158 to a suitable computer 160.

Transmitter 142 is suitably a class A amplifier having bandwidth sufficient to cover a desired bandwidth of Larmor frequencies, and is driven by signals from a modulator 162. Modulator 162 suitably comprises a balanced mixer (filtered) and is receptive of a pulse shape control signal from suitable microcomputer control 164 (as will be hereinafter described) and a signal at a desired Larmor carrier (center) frequency.

The Larmor carrier frequency signal is suitably developed from the output signal of a crystal oscillator 166 by a frequency synthesizer/phase generator 168 in a phase locked relationship with crystal 166 and suitable bandpass filter and level setting circuitry 170. Bandpass filter 170 operates to develop a sine wave with a predetermined constant envelope from the output of frequency synthesizer. A more detailed description of a suitable frequency synthesizer/phase generator 168 will be hereinafter provided in conjunction with FIG. 17. The generation of the Larmor center frequency signal is performed responsive to control signals from microcomputer controller 164.

Microcomputer controller 164, in essence, controls the sequence of events within the NMR system: the interfacing of a computer 160 with the system, display of data such as by a CRT terminal 172, the generation of field gradients, and the timing, amplitude, frequency and phase of transmitted electromagnetic signals. Microcomputer controller 164 is suitably based on a microcomputer such as an LSI-11. A microcomputer such as the LSI-11 can be modified for more rapid operation (for example, with respect to turning on or off the carrier signal, selection of gradient direction and selection of phase) by addition of special purpose hardwired interface circuits. Reference is made to "An NMR Sequencer for Imaging," by J. Hoenninger and L. Crooks in press.

In effecting generation of the magnetic field gradients, microcomputer controller 164 generates respective control signals indicative of desired gradient values and particular gradient directions. A similar control signal indicative of particular values of ΔB and/or Δf are generated, if desired. The gradient value control signals, and/or the ΔB signal, are applied to conventional voltage-to-current converters and amplifiers 174 which, in turn, apply the gradient signals to the appropriate ($g_z$) coils 122, 124; ($g_x$) coils 126, 128; and ($g_y$) coils 130, 132 and applies the ΔB signals to coils 134 and 136.

Microcomputer controller 164 provides control signals representative of the desired RF pulse shape to modulator 162 to thus set the amplitude and duration of the electromagnetic signals and, accordingly, the spin reorientation (nutation) angle, e.g., 90°, 190°, effected by the signal. The desired electromagnetic pulse shape and amplitude scale factor are maintained in memory and selectively utilized to develop the control signals.

In the selective irradiation process, it is desirable that the electromagnetic pulses have a narrow band frequency spectrum. Accordingly, a (sin t)/t pulse shape is utilized (which provides an almost square frequency spectrum). A Gaussian pulse shape (which provides a Gaussian frequency spectrum) has also been considered.

Microcomputer controller 164 also suitably includes provisions for controlling sampling by A/D converter 156 and for controlling transmission of data from DMA interface 158 to computer 160. Responsive to signals from microcomputer controller 164, A/D converter 156 takes a predetermined number of samples of the demodulated signals, and transmits the data to main computer 160 (memory 176) through DMA 158. When a group of samples is received by main computer 160, they are stored in the appropriate locations in memory 176. The programming of microcomputer controller 164 and main computer 160 are coordinated such that the data received from DMA 158 can be properly interpreted with respect to sequence. Thereafter a Fourier transform of the data is performed and the Fourier transforms of respective line scans are displayed on CRT display 178. If desired, provisions can be made for controlling servo-mechanisms for positioning the specimen (object 100) with respect to the various coils.

Figure 17:
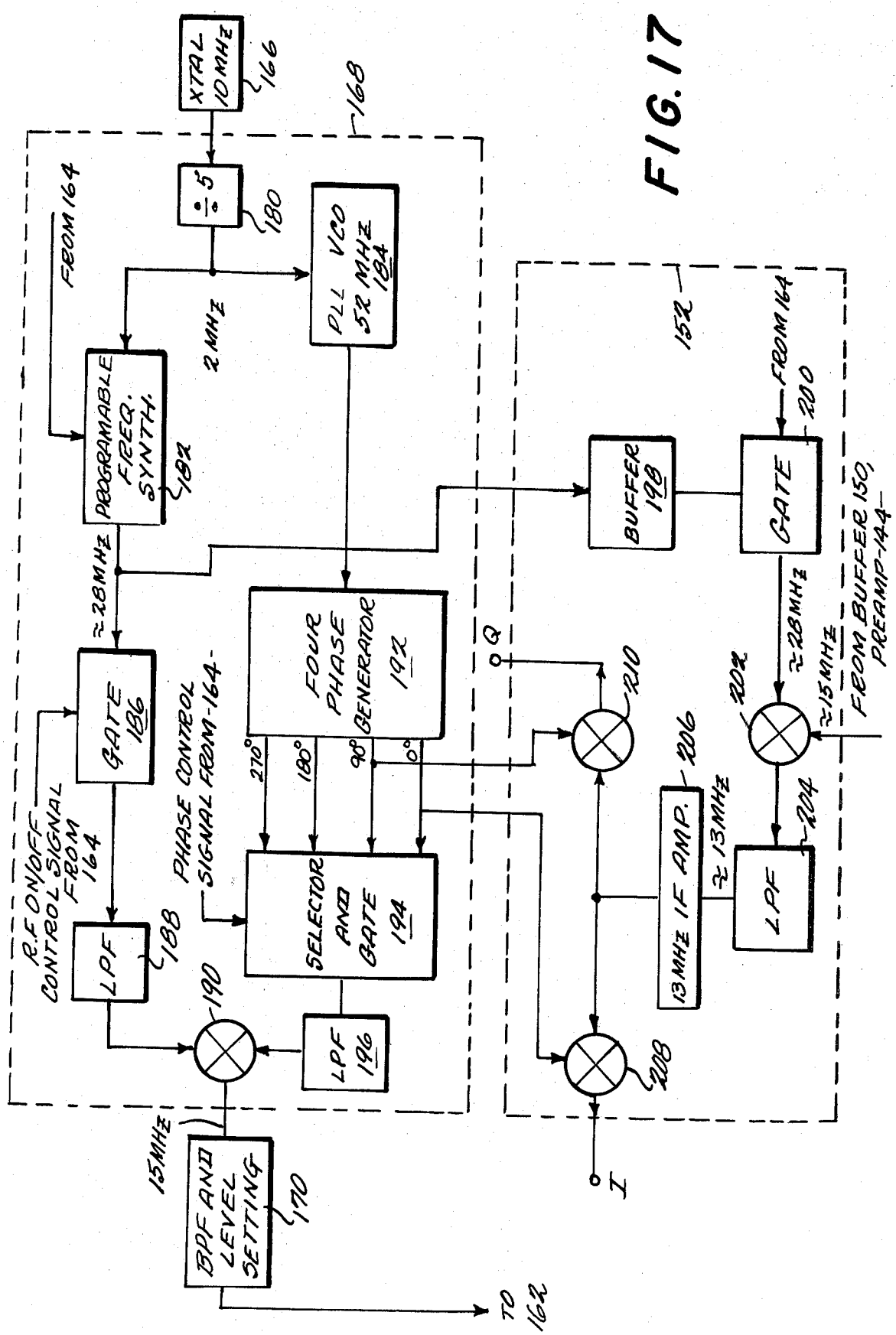
FIG. 17 is a schematic block diagram of the demodulator and frequency synthesizer/phase generator elements of FIG. 15B.

With reference now to FIG. 17, a more detailed description of a suitable quadrature demodulator 152 and a suitable frequency synthesizer/phase generator 168 will be provided. To minimize leakage, frequency synthesizer/phase generator 168 and demodulator 152 suitably operate primarily with intermediate frequencies other than the frequency actually transmitted by transmitter 142 and received by preamplifier 144. In this regard, reference is made to U.S. Pat. No. 3,651,396 issued Mar. 21, 1972 to Hewitt et al. Accordingly, crystal oscillator 166 provides a square-wave output signal of predetermined frequency (10 MHz) to frequency synthesizer/phase generator 168. Assuming the desired Larmor frequency to be on the order of 15 MHz, the 10 MHz oscillator signal is then suitably applied to a frequency divider 180 (÷5), to develop a 2 MHz signal. The 2 MHz signal is suitably applied to a programmable frequency synthesizer 182 and to a phase locked loop 184. Programmable frequency synthesizer 182 is receptive of control signals indicative of the desired frequency output from microcomputer controller 164. The output signal of frequency synthesizer 182 is applied through a gate 186, under the control of microcomputer controller 164 and lowpass filter 188, to a conventional balanced mixer 190.

Phase locked loop 184 suitably includes a voltage controlled oscillator operating about a predetermined center frequency such as 52 MHz, phase locked to the 2 MHz signal. The 52 MHz output signal of phase locked loop 184 is suitably applied to a conventional four phase generator 192 providing signals at the 13 MHz intermediate frequency with relative phases of 0°, 90°, 180°, and 270°. The output signals of phase generator 192 are applied to suitable selector gating circuitry 194, responsive to control signals from microcomputer controller 164. The selected intermediate frequency signal is passed through a lowpass filter 196 to mixer 190 to develop a difference signal component at the desired Larmor carrier frequency.

Assuming the desired frequency to be 15 MHz, programmable frequency synthesizer 182 is set by microcomputer controller 164 to provide a 28 MHz signal, whereby the difference component produced by modulator 190 (28 MHz–13 MHz) is at the desired 15 MHz frequency. The difference component is extracted by bandpass filter and level setting circuitry 170 to produce a sinewave of constant envelope at the desired Larmor carrier frequency.

The output of programmable frequency synthesizer 182 is also applied to a buffer amplifier 198 in demodulator 152. The buffered signal is applied through a gate 200 (under the control of microcomputer controller 164) to a balanced mixer 202. Mixer 202 is also receptive of the received signal as amplified by preamp 144 and buffer 150. In the example wherein the transmitted carrier frequency is 15 MHz, and the synthesizer output 28 MHz, the difference component of the output signal of mixer 202 will be at the intermediate frequency 13 MHz. The difference component is extracted from the mixer output signal by a lowpass filter 204 and is applied to a suitable IF amplifier 206 tuned to 13 MHz. The output signals from IF amplifier 206 are applied to respective balanced mixers 208 and 210. Mixers 208 and 210 are respectively receptive of the 0° and 90° phase intermediate signals from phase generator 192 in frequency synthesizer/phase generator 168. Thus, mixers 208 and 210 respectively provide inphase and quadrature audio frequency signals indicative of the respective magnetization components of the spin echo signal.

As noted above, the I and Q output signals are filtered and sampled, then stored in memory 176 of computer 160. Computer 160, in effect, computes the vector sum of the I and Q components and performs a Fourier transform on the vector sum to develop indicia of the indicative amplitudes of the respective frequency components of the spin echo signals.

It should be appreciated that since demodulator 152 and frequency synthesizer/phase generator 168 operate primarily at intermediate frequencies other than the Larmor carrier frequency, leakage from the transmitter into demodulator 152 is substantially reduced.

By way of example, the operation of the apparatus of FIGS. 15A, 15B, 16 and 17 during a single line scan will be described. The particular desired sequences of selective irradiations is entered (or recalled from memory) and the sequence initiated upon a ready signal from main computer 160 to microcomputer controller 164. Main magnet 120 is activated to bring the nuclear spins into initial alignment.

Microcomputer controller 164 computes or recalls from memory or a lookup table, the pulse shapes, amplitudes, phases and durations necessary to effect 90° and 180° spin nutations, the desired respective time intervals between pulses and the desired values of the gradients.

Appropriate control signals are generated to selectivity irradiate a particular volume (Y-Z plane 104, FIG. 2) with a 90° pulse. An appropriate signal is applied to $g_x$ coils 126 and 128 to develop an X gradient across object 100. An RF pulse shape signal of appropriate amplitude and duration to effect the desired rotational angle (i.e., 90°) is generated and applied to modulator 162.

Simultaneously, appropriate control signals are applied to frequency synthesizer/phase generator 168 to effect generation of a carrier signal at the Larmor frequency associated with plane 104. Programmable frequency synthesizer 182 (FIG. 17) is loaded with an appropriate frequency code from microcomputer controller 164, and a signal generation mode initiated.

As indicated above it is desirable to change the phase of the 90° and 180° RF pulses to selectively cause the resulting FIDs and spin echoes to assume different polarities. Accordingly, microcomputer controller 164 also generates an appropriate control signal to selector gate 194 of frequency synthesizer/phase generator 168 (FIG. 17) to pass the appropriately phased IF signal to mixer 190.

Modulator 162 thus applies a shaped RF pulse, at the desired Larmor frequency (and phase) to transmitter 142. Transmitter 142, accordingly, generates a signal through T network 140, RF switch 212 and 50 ohm matching network 138 to RF coil 114 and thereby irradiates object 100. Thus, Y-Z plane 104 in object 100 is excited to 90° by a process of selective irradiation.

Microcomputer controller 164 then generates appropriate gradient control signals of opposite polarity for a predetermined period, to generate a negative gradient for phase correction and then removes the gradient control signal from the $g_x$ coils 126, 128 and thereby turns off the X gradient.

An appropriate signal is applied to $g_z$ coils 122 and 124 to develop a Z gradient across object 100. After a predetermined time these signals are removed thereby turning off the Z gradient. The timing of these events may be modified so that the Z gradient is applied for a time which overlaps the time during which the X gradient used for phase correction is applied.

Appropriate control signals are then generated to effect selective irradiation of X-Z plane 106 (FIG. 2C) by a 180° pulse. An RF pulse shape signal of amplitude and duration corresponding to a 180° rotational angle is applied to modulator 162 and appropriate control signals are applied to frequency synthesizer 182 and phase selector 192 to set the frequency and phase of the carrier signal respectively. Gate 186 is enabled and the modulated signal (180° pulse) transmitted into the coil to effect the selective irradiation of plane 106. Simultaneously an appropriate signal is applied to $g_y$ coils 130 and 132 to develop a Y gradient across object 100. After the appropriate time duration has elapsed the transmitter and gradient are turned off via gate 186 and the gradient value output of microcomputer controller 164.

After a time period in accordance with the rule of equal times, the line of intersection 108 (FIG. 2D) of the transverse planes (104 and 106) generates a spin echo. At a time just prior to the expected generation of the spin echo, appropriate control signals are used to apply a gradient value signal to $g_z$ coils 122 and 124, and thus develop a Z gradient across object 100. Gate 200 is enabled to, in effect, turn on the demodulator.

The spin echo signals are induced in coil 114 and are applied through T network 140 to preamplifier 144 and thereafter through buffer 150 to quadrature demodulator 152. Quadrature demodulator 152 in cooperation with lowpass filter 154 produces an audio signal which is selectively sampled at a predetermined rate by A/D converter 156 in response to control signals from microcomputer controller 164. The digitized samples are then loaded into memory 176 through interface 158 and computer 160.

The sequence is repeated a predetermined number of times and appropriate signal averaging performed by computer 160. Fourier transforms are then performed by computer 160 and the results displayed on CRT display 178.

Where a multi-line scan is to be effected, subsequent selective irradiations of parallel planes are performed by either changing the carrier frequency by appropriate loading of programmable frequency synthesizer 182 with the Larmor frequency $\pm \Delta f$ and/or appropriate changes made in the basic magnetic field by application of appropriate $\Delta B$ signals to $\Delta B$ coils 134 and 136.

It should be appreciated that the above described apparatus is illustrative of the various types of apparatus that can be used to practice spin echo scanning sequences in accordance with the present invention. It should be appreciated that other apparatus can be utilized as well. For example, it is presently thought that the apparatus described in the Garroway et al U.S. Pat. No. 4,021,726 can be adapted for a spin echo scanning sequence. Further, it should be noted that while the various conductors shown interconnecting the elements of FIGS. 15A, 15B, 16 and 17 are shown as single lines, they are not so shown in a limiting sense and may comprise plural connections as is understood in the art.

It will be understood that the above description is of illustrative embodiments of the present invention, and that the invention is not limited to the specific forms shown. Modifications may be made in the sequence or arrangements of pulses or in the design or arrangement of elements without departing from the spirit of the invention as expressed in the appended claims.

What is claimed is:

1. In a method for generating a detectable signal related to the relative densities of nuclei within an object, the method comprising the steps of selectively exciting a predetermined volume by exciting intersecting regions within said object to generate an NMR response, said predetermined volume defined by the intersection of said regions, and repeating said exciting step at least once, the improvement wherein said repeating step further comprises:

repeating said exciting step for further regions defining further predetermined volumes outside of previously excited regions, the last region excitation occurring within the spin-lattice relaxation time of the first predetermined volume excitation.

2. A method for generating a detectable signal related to the relative densities of nuclei within an object, the method comprising the steps of:
(a) selectively exciting a predetermined volume by exciting intersecting regions within said object to produce a subsequent NMR response, said predetermined volume defined by the intersection of said regions; and
(b) repeating said step (a) at least once for further predetermined volumes, none of said predetermined volumes being disposed within previously excited regions, said step (b) occurring within the spin-lattice relaxation time of the predetermined volume excited in said step (a).

3. A method as in claim 1 or 2 wherein each of said region exciting steps further comprises the steps of:
generating a carrier having a predetermined frequency;
controllably modulating said carrier so that it has a predetermined frequency bandwidth;
generating a position variant magnetic field having a predetermined strength in said region and only in said region, said predetermined strength causing nuclei in said region to assume a Larmor frequency bandwidth equal to the frequency bandwidth of said modulated carrier; and
irradiating said sample with said modulated carrier.

4. A method for generating a detectable signal related to the relative densities of nuclei within an object, the method comprising the steps of:
(a) selectively exciting a first predetermined volume by exciting a first group of intersecting regions of said object, said first predetermined volume defined by the intersection of said first regions, to produce a subsequent NMR response;
(b) repeating said step (a) a plurality of times for first further predetermined volumes, none of said first further predetermined volumes being disposed within previously excited regions, said step (b) occurring within the spin-lattice relaxation time of said first predetermined volume;
(c) selectively exciting a second predetermined volume by exciting a second group of intersecting regions of said object, said second predetermined volume defined by the intersection of said second group of regions, said second predetermined volume being disposed within one of the regions excited in at least one of said step (a) and step (b) to produce a subsequent NMR response; and
(d) repeating said step (c) a plurality of times for second further predetermined volumes, said second further predetermined volumes being disposed outside of regions previously excited in said steps (c) and (d), said step (d) occurring within the spin-lattice relaxation time of the predetermined volume excited in said step (c).

5. A method for generating a detectable signal related to the relative densities of nuclei within an object, said nuclei having nuclear spins, the method comprising the steps of:
(a) selectively exciting one region to produce an NMR response;
(b) reversing the nuclear spins of atoms in another region at a predetermined time interval thereafter, the intersection of said one and another regions defining a predetermined volume, whereby the nuclei within said predetermined volume generate a spin echo signal centered in time at a point after said reversal equal to said predetermined time interval; and
(c) repeating said steps (a) and (b) at least once for further regions defining further predetermined volumes outside of previously excited regions, said step (c) occurring within the spin-lattice relaxation time of said step (b).

6. A method for generating a detectable signal related to the relative densities of nuclei within an object, said nuclei having nuclear spins, the method comprising the steps of:
(a) selectively exciting one region to produce an NMR response;
(b) reversing the nuclear spins of atoms in another region within said object transverse to said one region at a first predetermined time interval thereafter, the intersection of said one and another regions defining a first predetermined volume, whereby the nuclei within said first predetermined volume thereafter generate first spin echo signals at times in accordance with said first predetermined time interval;
(c) repeating said steps (a) and (b) at least once for further regions defining further predetermined volumes outside of previously excited regions, said step (c) occurring within the spin-lattice relaxation time of said step (b);
(d) selectively exciting one of said one and another regions to produce an NMR response;
(e) reversing the nuclear spins of atoms in a third region within said object at a second predetermined time interval thereafter, the intersection of said one of said one and another regions and said third region defining a second predetermined volume, whereby the nuclei within said second predetermined volume thereafter generate second spin echo signals at times in accordance with said second predetermined time intervals; and
(f) repeating said steps (d) and (e) at least once for further regions defining further predetermined volumes outside of regions excited in said steps (d) and (e) and repetitions thereof, said step (f) occurring within the spin-lattice relaxation time of said step (e).

7. A method for generating a detectable signal related to the relative densities of nuclei within an object, the method comprising the steps of:
(a) selectively exciting one planar volume to produce an NMR response;
(b) selectively exciting another planar volume transverse to said one planar volume, at a predetermined time interval thereafter, the intersection of said one and another planar volumes defining a predetermined volume, whereby the nuclei within said predetermined volume thereafter generate spin echo signals at times in accordance with said predetermined time interval;

(c) repeating said steps (a) and (b) at least once for further planar volumes defining further predetermined volumes disposed outside of previously excited planar volumes, said step (c) occurring within the spin-lattice relaxation time of the planar volume excited in said step (b).

8. A method for determining the relative densities of nuclei within an object, the method comprising the steps of:

(a) selectively exciting one planar volume to produce an NMR response;

(b) selectively exciting another planar volume transverse to said one planar volume, at a first predetermined time interval thereafter, the intersection of said one and another planar volumes defining a first predetermined volume, whereby the nuclei within said first predetermined volume thereafter generate first spin echo signals at times in accordance with said first predetermined time interval;

(c) detecting the intensity of said first spin echo signals to obtain a measure of the relative density of nuclei in said first predetermined volume;

(d) repeating said steps (a) through (c) a plurality of times for further planar volumes defining further predetermined volumes outside of previously excited planar volumes, the last planar volume excitation occurring within the spin-lattice relaxation time of the planar volume excited in said step (b);

(e) selectively exciting one of said one and another planar volumes to produce an NMR response;

(f) selectively exciting a third planar volume transverse to said one of said one and another planar volumes, at a second predetermined time interval thereafter, the intersection of said one of said one and another planar volumes and said third planar volume defining a second predetermined volume, whereby the nuclei within said second predetermined volume thereafter generate second spin echo signals at times in accordance with said second predetermined time interval;

(g) detecting the intensity of said second spin echo signals from said second predetermined volume to obtain a measure of the density of nuclei in said second predetermined volume; and (h) repeating said steps (e) through (g) a plurality of times for further planar volumes defining further predetermined volumes disposed outside of planar volumes previously excited in said steps (e) and (f) and repetitions of said steps (e) and (f), said repetitions of said steps (e) and (f) occurring within the spin-lattice relaxation time of said second predetermined volume.

9. A method for determining the relative densities of nuclei within an object, said nuclei having nuclear spins at Larmor frequencies in accordance with the intensity of a magnetic field operating thereon, the method comprising the steps of:

(a) selectively exciting one planar volume to nutate the nuclear spins of nuclei in said one planar volume by a first predetermined angle;

(b) reversing the nuclear spins of atoms in another planar volume at a predetermined time thereafter, the intersection of said one and another planar volumes defining a predetermined volume, whereby the nuclei within said predetermined volume generate spin echo signals centered in time at a point after said reversal equal to said predetermined time interval;

(c) detecting the intensity of said spin echo signals to obtain a measure of the relative density of nuclei in said predetermined volume; and (d) repeating said steps (a) through (c) at least once for further planar volumes defining further predetermined volumes outside of previously excited planar volumes, said at least once repetition of said step (b) occurring within the spin-lattice relaxation time of said step (b).

10. A method for determining the relative densities of nuclei within an object, said nuclei having nuclear spins at Larmor frequencies in accordance with the intensity of a magnetic field operating thereon, the method comprising the steps of:

(a) selectively exciting one planar volume to nutate the nuclear spins of nuclei in said one planar volume by a first predetermined angle;

(b) reversing the nuclear spins of atoms in another planar volume within said object transverse to said one planar volume at a first predetermined time interval thereafter, the intersection of said one and another planar volumes defining a first predetermined volume, whereby the nuclei within said first predetermined volume thereafter generate first spin echo signals at times in accordance with said first predetermined time interval;

(c) detecting the intensity of said first spin echo signals to obtain a measure of the relative density of nuclei in said first predetermined volume;

(d) repeating said steps (a) through (c) at least once for further planar volumes defining further predetermined volumes outside of previously excited planar volumes, said repetitions occurring within the spin-lattice relaxation time of said step (b);

(e) selectively exciting one of said one and another planar volumes to nutate the nuclear spins of nuclei in said one of said one and another planar volumes by a second predetermined angle;

(f) reversing the phase of nuclear spins of atoms in a third planar volume within said object at a second predetermined time interval thereafter, the intersection of said one of said one and another planar volumes and third planar volume defining a second predetermined volume, whereby the nuclei within said second predetermined volume thereafter generate second spin echo signals at times in accordance with said second predetermined time intervals;

(g) detecting the intensity of said second spin echo signals to obtain a measure of the relative density of nuclei in said second predetermined volume; and (h) repeating said steps (e) through (g) at least once for further planar volumes defining further predetermined volumes outside of planar volumes excited in said steps (e) and (f) and repetitions of said steps (e) and (f), said step (h) occurring within the spin-lattice relaxation time of said step (f).

11. In a method for determining the relative densities of nuclei within an object, said nuclei having nuclear spins at Larmor frequencies in accordance with the intensity of a magnetic field operating thereon, the method comprising the steps of: (a) selectively exciting one planar volume to nutate the nuclear spins of nuclei in said one planar volume by a first predetermined angle; (b) selectively exciting another planar volume transverse to one said planar volume, at a predetermined time interval thereafter, to nutate spins of nuclei in said another planar volume by a second predetermined angle, the intersection of said one and another planar volumes defining a predetermined volume, whereby the nuclei within said predetermined volume thereafter generate spin echo signals at times in accordance with said predetermined time intervals; (c) detecting the intensity of said spin echo signals to obtain a measure of the relative density of nuclei in said predetermined volumes; and (d) repeating steps (a) through (c) at least once, the improvement wherein:

said step (d) further comprises repeating said steps (a) through (c) for further planar volumes defining further predetermined volumes outside of previously excited planar volumes, the last repetition of said step (b) occurring within the spin-lattice relaxation time of said step (b); and said method further comprises the steps of:
  (e) selectively exciting one of said one and another planar volumes to nutate the nuclear spins in nuclei in said one of said one and another planar volumes by a third predetermined angle,
  (f) selectively exciting a third planar volume transverse to said one of said one and another planar volumes, at a second predetermined time interval thereafter, to nutate spins of nuclei in said third planar volume by a fourth predetermined angle, the intersection of said one and third planar volumes defining a second predetermined volume, whereby the nuclei within said second predetermined volume thereafter generate second spin echo signals at times in accordance with said second predetermined time interval,
  (g) detecting the intensity of said second spin echo signals to obtain a measure of the relative density of nuclei in said second predetermined volume, and
  (h) repeating said steps (e) through (g) at least once for further planar volumes defining further predetermined volumes outside of planar volumes previously excited in said steps (e) and (f), and repetitions of said steps (e) and (f), and last repetition of said step (f) occurring within the spin-lattice relaxation time of said step (f).

12. A method for determining the relative densities of nuclei within an object, said nuclei having nuclear spins at Larmor frequencies in accordance with the intensity of a magnetic field operating thereon, the method comprising the steps of:
  (a) selectively exciting one planar volume to nutate the nuclear spins of nuclei in said one planar volume by a first predetermined angle;
  (b) selectively exciting another planar volume transverse to said one planar volume, at a predetermined time interval thereafter, to nutate spins of nuclei in said another planar volume by a second predetermined angle, the intersection of said one and another planar volumes defining a predetermined volume, whereby the nuclei within said predetermined volume thereafter generate spin echo signals at times in accordance with said predetermined time interval;
  (c) detecting the intensity of said spin echo signals to obtain a measure of the relative density of nuclei in said predetermined volume; and
  (d) repeating said steps (a) through (c) at least once for further planar volumes defining further predetermined volumes disposed outside of previously excited planar volumes, said step (d), except the last repetition of said step (c), occurring within the spin-lattice relaxation time of said another planar volume excited in said step (b).

13. A method for determining the relative densities of nuclei within an object, said nuclei having nuclear spins at Larmor frequencies in accordance with the intensity of a magnetic field operating thereon, the method comprising the steps of:
  (a) generating, during a first time period, a position variant magnetic field across said object, said field having an intensity varying as a function of position along a first direction whereby nuclei in one planar volume perpendicular to said first direction assume nuclear spins at Larmor frequencies within a first predetermined range of frequencies;
  (b) selectively irradiating said object, during said first time period, with an electromagnetic signal having a frequency spectrum substantially consisting of components within said first predetermined range of frequencies and an amplitude and duration to nutate the nuclear spins of nuclei in said one planar volume by a first predetermined angle;
  (c) generating, during a second time period, a position variant magnetic field across said object, said field having an intensity varying as a function of position along a second direction transverse to said first direction whereby nuclei in another planar volume perpendicular to said second direction assume nuclear spins at Larmor frequencies within a second predetermined range of frequencies;
  (d) selectively irradiating said object, during said second time period, with an electromagnetic signal having a frequency spectrum substantially consisting of components within said second predetermined range of frequencies, said electromagnetic signal having an amplitude and duration to nutate spins of nuclei in said another planar volume by a second predetermined angle, said step (d) occurring at a predetermined time interval after said step (b), the intersection of said one and another planar volumes defining a predetermined volume, whereby the nuclei within said predetermined volume thereafter generate spin echo signals at times in accordance with said predetermined time interval;
  (e) detecting, during a third time period, the intensity of said spin echo signals to obtain a measure of the relative density of nuclei in said predetermined volume; and
  (f) repeating said steps (a) through (e) at least once for further planar volumes defining further predetermined volumes outside of previously excited planar volumes, the last repetition of said step (d) occurring within the spin-lattice relaxation time of said step (d).

14. A method as in claim 12 or 13 wherein said first predetermined angle is 90° and said second predetermined angle is 180°.

15. A method for determining the relative densities of nuclei within an object, said nuclei having nuclear spins at Larmor frequencies in accordance with the intensity of a magnetic field operating thereon, the method comprising the steps of:
  (a) disposing said object in an intense magnetic field to align the nuclear spins of nuclei within said object in accordance with a first predetermined direction;

(b) generating, during a first predetermined time period, a first position variant magnetic field to vary the intensity of the magnetic field within said object in accordance with position along a second predetermined direction, said position variant magnetic field causing the Larmor frequencies of said nuclei to vary as a function of the relative positions of said nuclei along said second predetermined direction;

(c) irradiating said object during said first predetermined period with a signal having a first frequency spectrum substantially consisting of components corresponding to a first predetermined band of said nuclei Larmor frequencies, to selectively excite said nuclei having Larmor frequencies within said predetermined band such that the nuclear spins of nuclei located in one planar volume of said object are oriented by a first predetermined angle with respect to the previous orientation thereof;

(d) generating, during a second predetermined time period subsequent to said first time period, a second position variant magnetic field to vary the magnetic field within said object in accordance with position along a third predetermined direction transverse to said second predetermined direction such that the Larmor frequencies of the nuclear spins of said nuclei within said object vary as a function of the relative position of said nuclei along said third predetermined direction;

(e) irradiating said object during said second predetermined time period with a second signal having a second frequency spectrum substantially consisting of frequency components corresponding to a second predetermined band of Larmor frequencies such that the nuclear spins of nuclei located in another planar volume are reoriented by a second predetermined angle with respect to the previous orientation thereof, said another planar volume intersecting said one planar volume at a predetermined volume within said object, the nuclei located within said predetermined volume thereafter, during a third time period, generating spin echo signals at the respective Larmor frequencies thereof;

(f) generating during said third time period a third position variant magnetic field to vary the intensity of the magnetic field within said object in accordance with position such that the Larmor frequencies of the nuclei vary as a function of relative position within said predetermined volume;

(g) determining the relative intensity of the frequency components of said spin echo signals, each of said spin echo signal frequency components being indicative of the relative density of nuclei disposed at an associated position within said predetermined volume; and (h) repeating said steps (b) through (g) at least once for further planar volumes defining further predetermined volumes outside of previously excited planar volumes, the last repetition of said step (e) occurring within the spin-lattice relaxation time of the said step (e).

16. A method as in claim 8 or 15 wherein planar volumes defining predetermined volumes are not orthogonal with respect to each other.

17. A method for determining the relative densities of nuclei within an object, said nuclei having nuclear spins at Larmor frequencies in accordance with the intensity of a magnetic field operating thereon, the method comprising the steps of:

(a) disposing said object in an intense first magnetic field to align the nuclear spins of nuclei within said object in accordance with a first predetermined direction;

(b) generating for a first predetermined time period a first position variant magnetic field to vary the intensity of the magnetic field within said object in accordance with position along a second predetermined direction, said first position varying magnetic field causing the Larmor frequencies of said nuclei to vary as a function of the relative positions of said nuclei along said second predetermined direction;

(c) irradiating said object during said first predetermined period with a first signal having a first frequency spectrum substantially consisting of frequency components corresponding to a first predetermined band of Larmor frequencies, to selectively excite said nuclei having Larmor frequencies within said first predetermined band, such that the nuclear spins of nuclei located in one planar volume of said object are reoriented by a first predetermined angle with respect to the previous orientation thereof;

(d) generating during a second predetermined time period subsequent to said first time period, a second position variant magnetic field to vary the magnetic field within said object in accordance with position along a third predetermined direction transverse to said second predetermined direction such that the Larmor frequencies of the nuclear spins of said nuclei within said object vary as a function of the relative position of said nuclei along said third predetermined direction;

(e) irradiating said object during said second predetermined time period with a second signal having a second frequency spectrum substantially consisting of frequency components corresponding to a second predetermined band of Larmor frequencies such that the nuclear spins of nuclei located in another planar volume are reoriented by a second predetermined angle with respect to the previous orientation thereof, said another planar volume intersecting said one planar volume at a first predetermined volume within said object, the nuclei located within said first predetermined volume thereafter, during a third time period, generating first spin echo signals at the respective Larmor frequencies thereof;

(f) generating during said third time period a third position variant magnetic field to vary the intensity of the magnetic field within said object in accordance with position along said first predetermined volume such that the Larmor frequencies of the nuclei vary as a function of relative position within said first predetermined volume;

(g) determining the relative intensity of the frequency components of said first spin echo signals, each of said spin echo signal frequency components being indicative of the relative density of nuclei disposed at an associated position within said first predetermined volume;

(h) repeating said steps (b) through (g) at least once for further planar volumes defining further predetermined volumes outside of previously excited planar volumes, the last repetition of said step (e) occurring within the spin-lattice relaxation time of said step (e);

(i) generating for a fourth predetermined time period a fourth position variant magnetic field to vary the intensity of a magnetic field within said object in accordance with position along one of said second and third predetermined directions, said fourth position variant magnetic field causing the Larmor frequencies of said nuclei to vary as a function of the relative positions of said nuclei along said one of said second and third predetermined directions;

(j) irradiating said object during said fourth predetermined time period with a signal having a third frequency spectrum to selectively excite said nuclei having Larmor frequencies within one of said one and another planar volumes, such that the nuclear spins of nuclei located in said one of said one and another planar volumes are reoriented by a third predetermined angle with respect to the previous orientation thereof;

(k) generating during a fifth predetermined time period subsequent to said fourth time period a fifth position variant magnetic field to vary the magnetic field within said object in accordance with position along a fourth predetermined direction transverse to said one of said second and third predetermined directions such that the Larmor frequencies of the nuclear spins of said nuclei within said object vary as a function of the relative position of said nuclei along said fourth predetermined direction;

(l) irradiating said object during said fifth predetermined time period with a fourth signal having a fourth frequency spectrum substantially consisting of frequency components corresponding to a fourth predetermined band of Larmor frequencies such that the nuclear spins of nuclei located in a third planar volume are reoriented by a fourth predetermined angle with respect to the previous orientation thereof, said third planar volume intersecting said one of said one and another planar volumes at a second predetermined volume of intersection within said object, the nuclei located within said second predetermined volume thereafter during a sixth time period generating second spin echo signals at the respective Larmor frequencies thereof;

(m) generating during said sixth time period a sixth position variant magnetic field to vary the intensity of the magnetic field within said object in accordance with a position along a fifth predetermined direction such that the Larmor frequencies of the nuclei vary as a function of relative position within said second predetermined volume;

(n) determining the relative intensity of the frequency components of said second spin echo signals, each of said second spin echo signal frequency components being indicative of the relative density of nuclei disposed at an associated position within said second predetermined volume; and (o) repeating said steps (i) through (n) at least once for further planar volumes defining further predetermined volumes outside of planar volumes irradiated in said steps (j) and (l) and repetitions of said steps (j) and (l), the last repetition of said step (l) occurring within the spin-lattice relaxation time of said step (l).

18. A method as in claim 17 wherein said first and third predetermined angles are 90° and said second and fourth predetermined angles are 180°.

19. A method for determining the relative densities of nuclei within an object, the method comprising the steps of:
(a) selectively exciting one region of said object to generate, for a period of time, a free induction decay signal (FID) having a polarity;
(b) selectively exciting another region transverse to said one region, at a predetermined time interval thereafter, the intersection of said one and another regions defining a predetermined volume, to generate from said predetermined volume a spin echo having a polarity, at times in accordance with said predetermined time interval and within said period of time, so that said FID interferes with said spin echo to produce a spin echo signal having an FID component and a spin echo component;
(c) detecting the intensity of said spin echo signal to obtain a measure of the relative density of nuclei in said predetermined volume;
(d) repeating said steps (a) through (c) at least once for said one and another regions, the phases of excitations in said step (a) and said at least one repetition of said step (a) being such that an arithmetic combination of said polarities of said FIDs is zero, the phases of excitations in said step (b) and said at least one repetition of said step (b) being such that said arithmetic combination of said polarities of said spin echoes is not zero; and
(e) combining corresponding portions of the spin echo signals detected in said step (c) and repetitions of said step (c) with said arithmetic combination so that said FID components cancel while said spin echo components do not cancel.

20. A method as in claim 19 wherein:
said step (a) comprises the steps of:
(1) generating a position variant magnetic field having a predetermined range of intensity in said one region and only in said one region, and
(2) selectively irradiating said object with a first electromagnetic signal having a frequency range to cause nutation only in said one region, the phase of said first electromagnetic signal producing an FID having a positive polarity; said step (b) further comprises the steps
(3) generating a position variant magnetic field across said object, the strength of said field having a predetermined range of values in said another region and only in said another region, and
(4) irradiating said object with a second electromagnetic signal having a frequency range to cause nutation only in said another region, said second electromagnetic signal having a phase of 90° with respect to said first electromagnetic signal to produce a spin echo having a positive polarity;
said step (d) further comprises the steps of:
(5) repeating said step (1),
(6) irradiating said object with a third electromagnetic signal having a frequency range to cause nutation only in said one region, said third electromagnetic signal having a phase of 180° with respect to said first electromagnetic signal to produce an FID having a negative polarity,
(7) repeating said step (3), and (8) irradiating said object with a fourth electromagnetic signal having a frequency range to cause nutation only in said another region, said fourth electromagnetic signal having a phase of 0° with respect to said first electromagnetic signal to produce a spin echo having a positive polarity; and said method further comprises the step of adding corresponding portions of said spin echo signals so that said FID components cancel and said spin echo components do not cancel.

21. A method as in claim 19 wherein:

said step (a) further comprises the steps of:
(1) generating a position variant magnetic field across said object, the intensity of said field having a predetermined range of values in said one region, and only in said one region, and
(2) selectively irradiating said object with a first electromagnetic signal having a frequency range to produce nutation of nuclei only in said one region, the phase of said first electromagnetic signal producing an FID having a positive polarity;

said step (b) further comprises the steps of:
(3) generating a position variant magnetic field across said object, the intensity of said magnetic field having a predetermined range of values in said another region, and only in said another region, and
(4) irradiating said object with a second electromagnetic signal having a frequency range to cause nutation of nuclei only in said another region, the phase of said second electromagnetic signal being 90° with respect to said first electromagnetic signal to produce a spin echo having a positive polarity;

said step (d) further comprises the steps of:
(5) repeating said step (1),
(6) irradiating said object with a third electromagnetic signal having a frequency range to cause nutation only in said one region, said third electromagnetic signal having a phase of 0° with respect to said first electromagnetic signal to produce an FID having a positive polarity,
(7) repeating said step (3),
(8) irradiating said object with a fourth electromagnetic signal having a frequency range to cause nutation only in said another region, said fourth electromagnetic signal having a phase of 270° with respect to said first electromagnetic signal to produce a spin echo having a positive polarity,
(9) repeating said step (1),
(10) irradiating said object with a fifth electromagnetic signal having a frequency range to cause nutation only in said one region, said fifth electromagnetic signal having a phase of 180° with respect to said first electromagnetic signal to produce an FID having a negative polarity,
(11) repeating said step (3),
(12) irradiating said object with a sixth electromagnetic signal having a frequency range to cause nutation only in said another region, said sixth electromagnetic signal having a phase of 0° with respect to said first electromagnetic signal to produce a spin echo having a positive polarity,
(13) repeating said step (1),
(14) irradiating said object with a seventh electromagnetic signal having a frequency range to cause nutation only in said one region, said seventh electromagnetic signal having a phase of 180° with respect to said first electromagnetic signal to produce an FID having a negative polarity,
(15) repeating said step (3), and
(16) irradiating said object with an eighth electromagnetic signal having a frequency range to cause nutation only in said another region, said eighth electromagnetic signal having a phase of 180° with respect to said first electromagnetic signal to produce a spin echo having a positive polarity; and said method further comprises the step of adding corresponding portions of said spin echo signals so that said FID components of said spin echo signals cancel while said spin echo components of said spin echo signals do not cancel.

22. A method as in claim 19 wherein:

said step (a) further comprises the steps of:
(1) generating a position variant magnetic field across said object, the intensity of said field having a predetermined range of values in said one region, and only in said one region, and
(2) selectively irradiating said object with a first electromagnetic signal having a frequency range to produce nutation of nuclei only in said one region, the phase of said first electromagnetic signal producing an FID having a positive polarity;

said step (b) further comprises the steps of:
(3) generating a position variant magnetic field across said object, the intensity of said magnetic field having a predetermined range of values in said another region, and only in said another region, and
(4) irradiating said object with a second electromagnetic signal having a frequency range to cause nutation of nuclei only in said another region, the phase of said second electromagnetic signal being 90° with respect to said first electromagnetic signal to produce a spin echo having a positive polarity;

said step (d) further comprises the steps of:
(5) repeating step (1),
(6) irradiating said object with a third electromagnetic signal having a frequency range to cause nutation only in said one region, said third electromagnetic signal having a phase of 180° with respect to said first electromagnetic signal to produce an FID having a negative polarity,
(7) repeating said step (3),
(8) irradiating said object with a fourth electromagnetic signal having a frequency range to cause nutation only in said another region, said fourth electromagnetic signal having a phase of 0° with respect to said first electromagnetic signal to produce a spin echo having a positive polarity,
(9) repeating said step (1),
(10) irradiating said object with a fifth electromagnetic signal having a frequency range to cause nutation only in said one region, said fifth electromagnetic signal having a phase of 0° with respect to said first electromagnetic signal to produce an FID having a positive polarity,
(11) repeating said step (3),
(12) irradiating said object with a sixth electromagnetic signal having a frequency range to cause nutation only in said another region, said sixth electromagnetic signal having a phase of 0° with respect to said first electromagnetic signal to produce a spin echo having a negative polarity,

(13) repeating said step (1),

(14) irradiating said object with a seventh electromagnetic signal having a frequency range to cause nutation only in said one region, said seventh electromagnetic signal having a phase of 180° with respect to said first electromagnetic signal to produce an FID having a negative polarity,

(15) repeating said step (3), and

(16) irradiating said object with an eighth electromagnetic signal having a frequency range to cause nutation only in said another region, said eighth electromagnetic signal having a phase of 90° with respect to said first electromagnetic signal to produce a spin echo having a negative polarity; and said method further comprises the steps of:

adding corresponding portions of the spin echo signals detected in step (c) and the first repetition of step (c) to produce a first composite signal wherein said FID components cancel while said spin echo components do not cancel, adding corresponding portions of the spin echo signals detected in the second repetition of step (c) and the third repetition of step (c) to produce a second composite signal wherein said FID components cancel and said spin echo components do not cancel, and subtracting corresponding portions of said first composite signal with corresponding portions of said second composite signal to produce a signal having no FID component and a spin echo component.

23. A method as in claim 2, 4 or 19 further comprising the step of initially aligning said spins in said object.

24. A method for determining the relative densities of nuclei within an object, said nuclei having nuclear spins at Larmor frequencies in accordance with the intensity of a magnetic field operating thereon, the method comprising the steps of:

(a) selectively exciting one planar volume to nutate the nuclear spins of nuclei in said one planar volume by a first predetermined angle, the nuclei within said one planar volume thereafter generating, for a period of time, a free induction decay (FID) having a polarity;

(b) selectively exciting another planar volume transverse to said one planar volume, at a predetermined time interval thereafter, to nutate spins of nuclei in said another planar volume by a second predetermined angle, the intersection of said one and another planar volumes defining a predetermined volume, whereby the nuclei within said predetermined volume generate a spin echo having a polarity at times in accordance with said predetermined time interval and within said period of time so that said FID interferes with said spin echo to produce a spin echo signal having an FID component and a spin echo component;

(c) detecting the intensity of said spin echo signal to obtain a measure of the relative density of nuclei in said predetermined volume;

(d) repeating said steps (a) through (c) at least once for said one and another planar volumes, the phases of excitations in said step (a) and said at least one repetition of said step (a) being such that an arithmetic combination of the polarities of said FIDs is zero, the phases of excitations in said step (b) and said at least one repetition of said step (b) being such that said arithmetic combination of the polarities of said spin echoes is not zero; and (e) combining corresponding portions of the spin echo signals detected in said step (c) and repetitions of said step (c) with said arithmetic combination so that said FID components cancel while said spin echo components do not cancel.

25. A method as in claim 24 wherein:

said step (a) comprises the steps of:

(1) generating a position variant magnetic field having a predetermined range of intensity in said one planar volume and only in said one planar volume, and (2) selectively irradiating said object with a first electromagnetic signal to cause said nutation only in said one planar volume, the phase of said first electromagnetic signal producing an FID having a positive polarity;

said step (b) further comprises the steps of:

(3) generating a position variant magnetic field across said object, the strength of said field having a predetermined range of values in said another planar volume, and only in said another planar volume, and (4) irradiating said object with a second electromagnetic signal having a frequency range to cause said nutation only in said another planar volume, said second electromagnetic signal having a phase of 90° with respect to said first electromagnetic signal to produce a spin echo having a positive polarity;

said step (d) further comprises the steps of:

(5) repeating said step (1), (6) irradiating said object with a third electromagnetic signal having a frequency range to cause said nutation only in said one planar volume, said third electromagnetic signal having a phase of 180° with respect to said first electromagnetic signal to produce an FID having a negative polarity, (7) repeating said step (3), and (8) irradiating said object with a fourth electromagnetic signal having a frequency range to cause said nutation only in said another planar volume, said fourth electromagnetic signal having a phase of 0° with respect to said first electromagnetic signal to produce a spin echo having a positive polarity; and said method further comprises the step of adding corresponding portions of said spin echo signals so that said FID components cancel and said spin echo components do not cancel.

26. A method as in claim 24 wherein:

said step (a) further comprises the steps of:

(1) generating a position variant magnetic field across said object, the intensity of said field having a predetermined range of values in said one planar volume and only in said one planar volume, and (2) selectively irradiating said object with a first electromagnetic signal having a frequency range to produce said nutation of nuclei only in said one planar volume, the phase of said first electromagnetic signal producing an FID having a positive polarity;

said step (b) further comprises the steps of:
(3) generating a position variant magnetic field across said object, the intensity of said magnetic field having a predetermined range of values in said another planar volume and only in said another planar volume, and
(4) irradiating said object with a second electromagnetic signal having a frequency range to cause said nutation of nuclei only in said another planar volume, the phase of said second electromagnetic signal being 90° with respect to said first electromagnetic signal to produce a spin echo having a positive polarity;

said step (d) further comprises the steps of:
(5) repeating said step (1),
(6) irradiating said object with a third electromagnetic signal having a frequency range to cause said nutation only in said one planar volume, said third electromagnetic signal having a phase of 0° with respect to said first electromagnetic signal to produce an FID having a positive polarity,
(7) repeating said step (3),
(8) irradiating said object with a fourth electromagnetic signal having a frequency range to cause said nutation only in said another planar volume, said fourth electromagnetic signal having a phase of 270° with respect to said first electromagnetic signal to produce a spin echo having a positive polarity,
(9) repeating said step (1),
(10) irradiating said object with a fifth electromagnetic signal having a frequency range to cause said nutation only in said one planar volume, said fifth electromagnetic signal having a phase of 180° with respect to said first electromagnetic signal to produce an FID having a negative polarity,
(11) repeating said step (3),
(12) irradiating said object with a sixth electromagnetic signal having a frequency range to cause nutation only in said another planar volume, said sixth electromagnetic signal having a phase of 0° with respect to said first electromagnetic signal to produce a spin echo having a positive polarity,
(13) repeating said step (1),
(14) irradiating said object with a seventh electromagnetic signal having a frequency range to cause said nutation only in said one planar volume, said seventh electromagnetic signal having a phase of 180° with respect to said first electromagnetic signal to produce an FID having a negative polarity,
(15) repeating said step (3), and
(16) irradiating said object with an eighth electromagnetic signal having a frequency range to cause said nutation only in said another planar volume, said eighth electromagnetic signal having a phase of 180° with respect to said first electromagnetic signal to produce a spin echo having a positive polarity; and said method further comprises the step of adding corresponding portions of said spin echo signals so that said FID components of said spin echo components cancel while said spin echo components of said spin echo signals do not cancel.

27. A method as in claim 24 wherein:
said step (a) further comprises the steps of:
(1) generating a position variant magnetic field across said object, the intensity of said field having a predetermined range of values in said one planar volume and only in said one planar volume, and
(2) selectively irradiating said object with a first electromagnetic signal having a frequency range to produce nutation of nuclei only in said one planar volume, the phase of said first electromagnetic signal producing an FID having a positive polarity;

said step (b) further comprises the steps of:
(3) generating a position variant magnetic field across said object, the intensity of said magnetic field having a predetermined range of values in said another planar volume and only in said another planar volume, and
(4) irradiating said object with a second electromagnetic signal having a frequency range to cause nutation of nuclei only in said another planar volume, the phase of said second electromagnetic signal being 90° with respect to said first electromagnetic signal to produce a spin echo having a positive polarity;

said step (d) further comprises the steps of:
(5) repeating said step (1),
(6) irradiating said object with a third electromagnetic signal having a frequency range to cause nutation only in said one planar volume, said third electromagnetic signal having a phase of 180° with respect to said first electromagnetic signal to produce an FID having a negative polarity,
(7) repeating said step (3),
(8) irradiating said object with a fourth electromagnetic signal having a frequency range to cause nutation only in said another planar volume, said fourth electromagnetic signal having a phase of 0° with respect to said first electromagnetic signal to produce a spin echo having a positive polarity,
(9) repeating said step (1),
(10) irradiating said object with a fifth electromagnetic signal having a frequency range to cause nutation only in said one planar volume, said fifth electromagnetic signal having a phase of 0° with respect to said first electromagnetic signal to produce an FID having a positive polarity,
(11) repeating said step (3),
(12) irradiating said object with a sixth electromagnetic signal having a frequency range to cause nutation only in said another planar volume, said sixth electromagnetic signal having a phase of 0° with respect to said first electromagnetic signal to produce a spin echo having a negative polarity,
(13) repeating said step (1),
(14) irradiating said object with a seventh electromagnetic signal having a frequency range to cause nutation only in said one planar volume, said electromagnetic signal having a phase of 180° with respect to said first electromagnetic signal to produce an FID having a negative polarity,
(15) repeating said step (3), and
(16) irradiating said object with an eighth electromagnetic signal having a frequency range to cause nutation only in said another planar volume, said eighth electromagnetic signal having a phase of 90° with respect to said first electromagnetic signal to produce a spin echo having a negative polarity; and said method further comprises the steps of:
adding corresponding portions of the spin echo signals detected in step (c) and the first repetition of step (c) to produce a first composite signal wherein said FID components cancel while said spin echo components do not cancel,
adding corresponding portions of the spin echo signals detected in the second repetition of step (c) and the third repetition of step (c) to produce a second composite signal wherein said FID components cancel and said spin echo components do not cancel, and
subtracting corresponding portions of said first composite signal with corresponding portions of said second composite signal to produce a signal having no FID component and a spin echo component.

28. A method as in claim 8 or 24 wherein each of said exciting steps further comprises the steps of:
generating a carrier having a predetermined frequency;
controllably modulating said carrier to have a predetermined range of frequencies;
generating a position variant magnetic field having a predetermined strength in the excited planar volume and only in the excited planar volume, said predetermined strength causing nuclei in said planar volume to assume a range of Larmor frequencies equal to the range of frequencies of said modulated carrier; and
irradiating said sample with said modulated carrier.

29. A method as in claim 1, 2, 4 or 24 wherein said spin-lattice relaxation time is five $T_1$.

30. A method for determining the relative densities of nuclei within an object, said nuclei having nuclear spins at Larmor frequencies in accordance with the intensities of a magnetic field operating thereon, the method comprising the steps of:
(a) selectively exciting one planar volume to nutate the nuclear spins of nuclei in said one planar volume by a first predetermined angle, the nuclei within said one planar volume thereafter generating, for a period of time, a free induction decay (FID) having a polarity;
(b) reversing the nuclear spins of atoms in another planar volume within said object transverse to said one planar volume at a predetermined time thereafter, the intersection of said one and another planar volumes defining a predetermined volume, said predetermined volume generating a spin echo centered in time at the point after said reversal equal to said predetermined time interval, and within said period of time so that said FID interferes with said spin echo to produce a spin echo signal having a polarity and an FID component and a spin echo component;
(c) detecting the intensity of said spin echo signals to obtain a measure of the relative density of nuclei in said predetermined volume;
(d) repeating said steps (a) through (c) at least once for said one and another planar volumes, the phases of excitations in said step (a) and said at least one repetition of said step (a) being such that an arithmetic combination of the polarities of said FIDs is zero, and said arithmetic combination of the polarities of said spin echoes is not zero; and
(e) combining corresponding portions of said spin echo signals with said arithmetic combination so that said FID components cancel while said spin echo components do not cancel.

31. A method for detecting the relative densities of nuclei within an object, said nuclei having nuclear spins at Larmor frequencies in accordance with the intensity of a magnetic field operating thereon, the method comprising the steps of:
(a) generating, for a first predetermined time period, a first position variant magnetic field within said object, said position variant magnetic field causing the Larmor frequencies of nuclei in said object to vary as a function of the relative positions of said nuclei within said object;
(b) irradiating said object during said first predetermined period with a signal having a first frequency spectrum substantially consisting of components corresponding to a first predetermined band of said nuclear Larmor frequencies, to selectively excite said nuclei in one planar volume having Larmor frequencies within said predetermined band, such that the nuclear spins of nuclei located in said one planar volume are reoriented by a first predetermined angle, the nuclei within said one planar volume thereafter generating, for a period of time, a free induction decay (FID) having a polarity;
(c) generating, for a second predetermined time period, a second position variant magnetic field to vary the intensity of the magnetic field within said object in accordance with position, said position variant magnetic field causing Larmor frequencies of said nuclei to vary as a function of the relative positions of said nuclei;
(d) irradiating said object during said second predetermined period with a signal having a second frequency spectrum substantially consisting of components corresponding to a second predetermined band of said nuclear Larmor frequencies, to selectively excite said nuclei having Larmor frequencies within another planar volume, transverse to said one planar volume, such that the nuclear spins of nuclei within said another planar volume are reoriented by a second predetermined angle, the intersection of said one and another planar volumes defining a predetermined volume, whereby the nuclei within said predetermined volume generate a spin echo at a time in accordance with said predetermined time interval and within said period of time so that said FID interferes with said spin echo to produce a spin echo signal having a polarity and an FID component and a spin echo component;
(e) detecting the intensity of said spin echo signals to obtain a measure of the relative density of nuclei in said predetermined volume;
(f) repeating said steps (a) through (e) at least once for said one and another planar volumes, the phases of excitations in said step (b) and said at least one repetition of said step (b) being such that an arithmetic combination of the polarities of said FIDs is zero, the phases of excitations in said step (d) and said at least one repetition of said step (d) being such that said arithmetic combination of the polarities of said spin echoes is not zero; and (g) combining corresponding portions of the spin echo signals detected in said step (e) and repetitions of said step (e) with said arithmetic combination so that said FID components cancel while said spin echo components do not cancel.

32. A method as in claim 1, 2, 4, 11, 24 or 31 wherein said relative density is selected from the group consisting of a relative normal density, a $T_1$ modified relative density, and a $T_2$ modified relative density.

33. A method for determining the relative densities of nuclei within an object, said nuclei having nuclear spins at Larmor frequencies in accordance with the intensity of a magnetic field operating thereon, the method comprising the steps of:

(a) disposing said object in an intense first magnetic field to align the nuclear spins of said atoms in accordance with a first predetermined direction;

(b) generating for a first predetermined time period a first position variant magnetic field to vary the intensity of the magnetic field within said object in accordance with position along a second predetermined direction, said position variant magnetic field causing the Larmor frequencies of said nuclei to vary as a function of the relative positions of said nuclei along said second predetermined direction;

(c) irradiating said object during said first predetermined period with a signal having a first frequency spectrum substantially consisting of components corresponding to a first predetermined band of said nuclear Larmor frequencies, to selectively excite said nuclei having Larmor frequencies within said predetermined band, such that nuclear spins of nuclei located in one planar volume in said object are reoriented by a first predetermined angle with respect to the previous orientation thereof, the nuclei within said one planar volume thereafter generating, for a period of time, a free induction decay (FID) having a polarity for a period;

(d) generating during a second predetermined time period subsequent to said first time period, a second position variant magnetic field to vary the magnetic field within said object in accordance with position along a third predetermined direction transverse to said second predetermined direction such that the Larmor frequencies of the nuclear spins of said nuclei within said object vary as a function of the relative position of said nuclei along said third predetermined direction;

(e) irradiating said object during said second predetermined time period with a second signal having a second frequency spectrum substantially consisting of frequency components corresponding to a second predetermined band of Larmor frequencies such that the nuclear spins of nuclei located in another planar volume are reoriented by a second predetermined angle with respect to the previous orientation thereof, said another planar volume intersecting said one planar volume at a predetermined volume within said object, the nuclei located in said predetermined volume thereafter, during a third time period, generating a spin echo at a time in accordance with said predetermined time interval and within said period of time so that said FID interferes with said spin echo to produce a spin echo signal having a polarity and an FID component and a spin echo component;

(f) generating during said third time period a third position variant magnetic field to vary the intensity of the magnetic field within said object in accordance with the position within said predetermined volume such that the Larmor frequencies of the nuclei vary as a function of relative position within said predetermined volume;

(g) determining the relative intensity of the frequency components of said spin echo signals, each of said spin echo signal frequency components being indicative of the relative density of nuclei disposed at an associated position within said predetermined volume;

(h) repeating said steps (b) through (g) at least once for said one and another planar volumes, the phases of said signals in said step (c) and said at least one repetition of said step (c) being such that an arithmetic combination of the polarities of said FIDs is zero, the phases of said signals in said step (e) and said at least one repetition of said step (e) being such that said arithmetic combination of the polarities of said spin echoes is not zero; and (i) combining corresponding portions of the spin echo signals determined in said step (g) and repetitions of said step (g) with said arithmetic combination so that said FID components cancel while said spin echo components do not cancel.

34. In apparatus for generating a detectable signal related to the relative densities of nuclei within an object, said apparatus comprising: (1) means, responsive to a control signal, for selectively exciting a predetermined volume by exciting intersecting regions within said object, said predetermined volume defined by the intersection of said regions, to produce spin echo signals; and (2) means for generating said control signal, the improvement wherein said generating means further comprises:

means for repetitively generating said control signal a first and at least a second time, said generating means including means for modifying said control signal so that further predetermined volumes disposed outside of previously excited regions are excited, said generating means generating said control signal for said at least a second time within a predetermined period after said first control signal generation so that the last predetermined volume excitation occurs within the spin-lattice relaxation time of the first predetermined volume excitation.

35. In apparatus for determining the relative densities of nuclei within an object, said apparatus comprising: (1) means, responsive to a first control signal for selectively exciting a predetermined volume by exciting intersecting regions within said object, said predetermined volume defined by the intersection of said regions, to produce spin echo signals; (2) means, responsive to a second control signal, for detecting the intensity of said spin echo signals to obtain a measure of the relative density of nuclei in said predetermined volume; and (3) means for generating said first and second control signals, the improvement wherein said generating means further comprises:

means for repetitively generating said first and second control signals in sequence, said generating means including:

first means for generating said control signals at a first occasion and at a plurality of occasions after said first occasion during a first time segment, said first means including means for modifying said first control signal so that at said plurality of occasions further regions defining further predetermined volumes disposed outside of previously excited regions are excited, said first means generating said first control signal at said plurality of occasions within a period after said first control signal generation so that the last region excitation occurs within the spin-lattice relaxation time of the first predetermined volume excited, and second means for generating said control signals at a first occasion and at a plurality of occasions after said first occasion during a second time segment after said first time segment, said second means including means for modifying said first control signal so that said second means excites, at the first occasion of the generation of said first control signal, at least one of said regions defining said predetermined volume first excited by said first means, said second means excites, at said plurality of occasions, further regions defining further predetermined volumes disposed outside of regions previously excited in response to control signals generated by said second means, said second means generating said first control signal at said plurality of occasions within a period after said first first control signal generation by said second means so that the last region excitation occurs within the spin-lattice relaxation time of the first predetermined volume excitation in response to control signals generated by said second means.

36. Apparatus for generating a detectable signal related to the relative densities of nuclei within an object, the apparatus comprising:

means, responsive to a control signal, for selectively exciting a predetermined volume by exciting intersecting regions of said object, said predetermined volume defined by the intersection of said regions to produce a subsequent NMR response; and means for repetitively generating said control signal a first and at least a second time, said generating means including means for modifying said control signal so that none of said predetermined volumes are disposed within previously excited regions, said generating means generating said control signal for said at least a second time within a predetermined period after said first control signal generation so that the last predetermined volume excitation occurs within the spin-lattice relaxation time of the first predetermined volume excitation.

37. Apparatus for generating a detectable signal related to the relative densities of nuclei within an object, said apparatus comprising:

means, responsive to a control signal, for selectively exciting a first predetermined volume by exciting intersecting regions in said object, said first predetermined volume defined by the intersection of said regions to produce a subsequent NMR response; said means for repetitively generating said control signal, said generating means including:

first means for generating said control signal at a first occasion and at a plurality of occasions after said first occasion during a first time segment, said first means including means for modifying said control signal so that at said plurality of occasions further predetermined volumes disposed outside of previously excited regions are excited, said first means generating said control signal at said plurality of occasions within a period after said first control signal generation so that the last region excitation occurs within the spin-lattice relaxation time of said first predetermined volume, and second means for generating said control signal at a first occasion and at a plurality of occasions after said first occasion during a second time segment after said first time segment, said second means including means for modifying said control signal so that said second means excites, at the first occasion of the generation of said control signal, at least one of said regions defining said first predetermined volume, and said second means excites, at said plurality of occasions, further predetermined volumes disposed outside of planar volumes previously excited in response to said control signals generated by said second means, said second means generating said control signal at said plurality of occasions within a period after said first control signal generation by said second means so that the last region excitation occurs within the spin-lattice relaxation time of the first predetermined volume excitation in response to control signals generated by said second means.

38. Apparatus as in claim 34 or 37 wherein each of said means for exciting further comprises:

means for generating a carrier having a predetermined frequency;

means for controllably modulating said carrier to have a predetermined range of frequencies;

means for generating a position variant magnetic field having a predetermined strength in the excited region and only in the excited region, said predetermined strength causing nuclei in said region to assume a range of Larmor frequencies equal to the range of frequencies of said modulated carrier; and irradiating said sample with said modulated carrier.

39. Apparatus for generating a detectable signal related to the relative densities of nuclei within an object, said apparatus comprising:

means, responsive to a first control signal, for selectively exciting one region to produce an NMR response;

means, responsive to a second control signal, for reversing the nuclear spins of atoms in another region at a predetermined time, thereafter, the intersection of said one and another regions defining a predetermined volume, whereby the nuclei within said predetermined volume generate a spin echo signal centered in time at a point after said phase reversal equal to said predetermined time; and means for repetitively generating said first and second control signals in sequence a first and at least a second time, said generating means including means for modifying said control signals so that said predetermined volumes are disposed outside of previously excited regions, said generating means generating said control signals for said at least a second time within a predetermined period after said first second control signal generation so that the last predetermined volume excitation occurs within the spin-lattice relaxation time of the first predetermined volume excitation.

40. Apparatus for generating a detectable signal related to the relative densities of nuclei within an object, said apparatus comprising:

means, responsive to a first control signal, for selectively exciting one region;

means, responsive to a second control signal, for reversing the nuclear spins of nuclei in another region within said object transverse to said one region at a predetermined time interval thereafter, the intersection of said one and another regions defining a predetermined volume, whereby the nuclei within said predetermined volume thereafter generate spin echo signals at times in accordance with said predetermined time interval; and means for repetitively generating said first and second control signals in sequence, said generating means including:

first means for generating said control signals at a first occasion and at a plurality of occasions after said first occasion during a first time segment, said first means including means for modifying said first and second control signals so that at said plurality of occasions, further regions defining predetermined volumes disposed outside of previously excited regions are excited, said first means generating said first and second control signals at said plurality of occasions within a period after said first second control signal generation so that the last region excitation occurs within the spin-lattice relaxation time of said another region, and second means for generating said control signals at a first occasion and at a plurality of occasions after said first occasion during a second time segment after said first time segment, said second means including means for modifying said first and second control signals so that said second means excites, at the first occasion of the generation of said first and second control signals, at least one of said one and another regions, and said second means excites, at said plurality of occasions further regions defining further predetermined volumes disposed outside of regions previously excited in response to control signals generated by said second means, said second means generating said first second control signal at said plurality of occasions within a period after said first and second control signals generation by said second means so that the last region excitation occurs within the spin-lattice relaxation time of the first predetermined volume excitation in response to control signals generated by said second means.

41. Apparatus for determining the relative densities of nuclei within an object, said nuclei having nuclear spins at Larmor frequencies in accordance with the intensity of a magnetic field operating thereon, said apparatus comprising:

means, responsive to a first control signal, for selectively exciting one planar volume to nutate the nuclear spins of nuclei in said one planar volume by a first predetermined angle;

means, responsive to a second control signal, for reversing the nuclear spins of atoms in another planar volume at a predetermined time thereafter, the intersection of said one and another planar volumes defining a predetermined volume, whereby the nuclei within said predetermined volume generate a spin echo signal centered in time at a point after said phase reversal equal to said predetermined time;

means, responsive to a third control signal, for detecting the intensity of said spin echo signals to obtain a measure of the relative density of nuclei in said predetermined volume; and means for repetitively generating said first, second and third control signals in sequence a first and at least a second time, said generating means including means for modifying said first and second control signals so that said predetermined volumes are disposed outside of previously excited planar volumes, said generating means generating said first and second control signals for said at least a second time within a predetermined period after said first second control signal generation so that the last predetermined volume excitation occurs within the spin-lattice relaxation time of the first predetermined volume excitation.

42. Apparatus for determining the relative densities of nuclei within an object, said nuclei having nuclear spins at Larmor frequencies in accordance with the intensity of a magnetic field operating thereon, said apparatus comprising:

means, responsive to a first control signal, for selectively exciting one planar volume to nutate the nuclear spins of nuclei in said one planar volume by a first predetermined angle;

means, responsive to a second control signal, for reversing the nuclear spins of nuclei in another planar volume within said object transverse to said one planar volume at a predetermined time interval thereafter, the intersection of said one and another planar volumes defining a predetermined volume, whereby the nuclei within said predetermined volume thereafter generate spin echo signals at times in accordance with said predetermined time interval;

means, responsive to a third control signal, for detecting the intensity of said spin echo signals to obtain a measure of the relative density of nuclei in said predetermined volume; and means for repetitively generating said first, second and third control signals in sequence, said generating means including:

first means for generating said control signals at a first occasion and at a plurality of occasions after said first occasion during a first time segment, said first means including means for modifying said first and second control signals so that at said plurality of occasions further planar volumes defining further predetermined volumes disposed outside of previously excited planar volumes are excited, said first means generating said first second control signals at said plurality of occasions within a period after said first and second control signal generation so that the last planar volume excitation occurs within the spin-lattice relaxation time of said another planar volume, and second means for generating said control signals at a first occasion and at a plurality of occasions after said first occasion during a second time segment after said first time segment, said second means including means for modifying said first and second control signals so that said second means excites at the first occasion of the generation of said first and second control signals, at least one of said one and another planar volumes, and said second means excites, at said plurality of occasions, further planar volumes defining further predetermined volumes disposed outside of planar volumes previously excited in response to control signals generated by said second means, said second means generating said first and second control signals at said plurality of occasions within a period after said first second control signal generation by said second means so that the last planar volume excitation occurs within the spin-lattice relaxation time of the first predetermined volume excitation in response to control signals generated by said second means.

43. Apparatus for determining the relative densities of nuclei within an object, said nuclei having nuclear spins at Larmor frequencies in accordance with the intensity of a magnetic field operating thereon, said apparatus comprising:

means, responsive to a first control signal, for selectively exciting one planar volume to nutate the nuclear spins of nuclei in said one planar volume by a first predetermined angle;

means, responsive to a second control signal, for selectively exciting another planar volume transverse to said one planar volume at a predetermined time interval thereafter, to nutate spins of nuclei in said another planar volume by a second predetermined angle, the intersection of said one another planar volumes defining a predetermined volume, whereby the nuclei within said predetermined volume thereafter generate spin echo signals at times in accordance with said predetermined time interval;

means, responsive to a third control signal, for detecting the intensity of said spin echo signals to obtain a measure of the relative density of nuclei in said predetermined volume; and means for repetitively generating said first, second and third control signals in sequence a first time and at least a second time after said first time, said generating means including means for modifying said first and second control signals so that further planar volumes defining further predetermined volumes disposed outside of previously excited planar volumes are excited, said generating means generating said first and second control signals for said at least a second time within a predetermined period after said first and second control signal generation so that the last planar volume excitation occurs within the spin-lattice relaxation time of said another planar volume.

44. Apparatus as in claim 42 or 43 wherein said exciting means further comprises means for exciting planar volumes defining predetermined volumes, each of said planar volumes defining each predetermined volume not being orthogonal with the other of said planar volumes defining each predetermined volume.

45. Apparatus for determining the relative densities of nuclei within an object, said nuclei having nuclear spins at Larmor frequencies in accordance with the intensity of a magnetic field operating thereon, said apparatus comprising:

means, responsive to a first control signal, for selectively exciting one planar volume to nutate the nuclear spins of nuclei in said one planar volume by a first predetermined angle;

means, responsive to a second control signal, for selectively exciting another planar volume transverse to said one planar volume, at a first predetermined time interval thereafter, to nutate spins of nuclei in said another planar volume by a second predetermined angle, the intersection of said one and another planar volumes defining a first predetermined volume, whereby the nuclei within said first predetermined volume thereafter generate first spin echo signals at times in accordance with said first predetermined time interval;

means, responsive to a third control signal, for detecting the intensity of said first spin echo signals to obtain an indication of the relative density of nuclei in said first predetermined volume; and means for repetitively generating said first, second and third control signals in sequence, said generating means including:

first means for generating said control signals at a first occasion and at a plurality of occasions after said first occasion during a first time segment, said first means including means for modifying said first and second control signals so that at said plurality of occasions further planar volumes defining further predetermined volumes disposed outside of previously excited planar volumes are excited, said first means generating said first second control signals at said plurality of occasions within a period after said first second control signal generation so that the last planar volume excitation occurs within the spin-lattice relaxation time of said another planar volume, and second means for generating said control signals at a first occasion and at a plurality of occasions after said first occasion during a second time segment after said first time segment, said second means including means for modifying said first and second control signals so that said second means excites, at the first occasion of the generation of said first and second control signals, at least one of said one and another planar volumes, and said second means excites, at said plurality of occasions, further planar volumes defining further predetermined volumes disposed outside of planar volumes previously excited in response to control signals generated by said second means, said second means generating said first and second control signals at said plurality of occasions within a period after said first second control signal generation by said second means so that the last planar volume excitation occurs within the spin-lattice relaxation time of the first predetermined volume excitation in response to control signals generated by said second means.

46. Apparatus for determining the relative densities of nuclei within an object, said nuclei having nuclear spins and Larmor frequencies in accordance with the intensity of a magnetic field operating thereon, said apparatus comprising:

means, responsive to a first control signal, for generating a position variant magnetic field across said object, said field having an intensity varying as a function of position along a first direction whereby nuclei in one planar volume perpendicular to said first direction assume nuclear spins at Larmor frequencies within a first predetermined range;

means responsive to a second control signal, for selectively irradiating said object with an electromagnetic signal having a frequency spectrum substantially consisting of components within said first predetermined range and an amplitude and duration to nutate the nuclear spins of nuclei in said one planar volume by a first predetermined angle;

means, responsive to a third control signal, for generating a position variant magnetic field across said object, said field having an intensity varying as a function of position along a second direction transverse to said first direction whereby nuclei in another planar volume perpendicular to said second direction assume nuclear spins at Larmor frequencies within a second predetermined range;

means, responsive to a fourth control signal, for selectively irradiating said object with an electromagnetic signal having a frequency spectrum substantially consisting of components within said second predetermined range, said electromagnetic signal having an amplitude and duration to nutate spins of nuclei in said another planar volume by a second predetermined angle at a predetermined time interval after said second control signal responsive irradiation, the intersection of said one and another planar volumes defining a predetermined volume, whereby the nuclei within said predetermined volume thereafter generate spin echoes at times in accordance with said predetermined time interval;

means, responsive to a fifth control signal, for detecting the intensity of said spin echo signals to obtain a measure of the density of nuclei in said predetermined volume; and means for repetitively generating said first, second, third, fourth and fifth control signals in sequence a first time and at least a second time after said first time, said generating means including means for modifying at least one of said first and second control signals and at least one of said third and fourth control signals so that further planar volumes defining further predetermined volumes disposed outside of previously excited planar volumes are excited, said generating means generating said second and fourth control signals for said at least a second time within a predetermined period after said first fourth control signal generation so that the last planar volume excitation occurs within the spin-lattice relaxation time of said another planar volume.

47. Apparatus for determining the relative densities of nuclei within an object, said nuclei having nuclear spins at Larmor frequencies in accordance with the intensity of a magnetic field operating thereon, said apparatus comprising:

disposing said object in an intense magnetic field to align the nuclear spins of nuclei in accordance with a first predetermined direction;

means, responsive to a first control signal, for generating, during a first predetermined time period a first position variant magnetic field to vary the intensity of the magnetic field within said object in accordance with position along a second predetermined direction, said position variant magnetic field causing the Larmor frequencies of said nuclei to vary as a function of the relative positions of said nuclei along said second predetermined direction;

means, responsive to a second control signal, for irradiating said object during said first predetermined period with a signal having a first frequency spectrum substantially consisting of components corresponding to a first predetermined band of said Larmor frequencies, to selectively excite said nuclei having Larmor frequencies within said predetermined band such that the nuclear spins of nuclei located in one planar volume of said object are oriented by a first predetermined angle with respect to the previous orientation thereof;

means, responsive to a third control signal, for generating, during a second predetermined time period subsequent to said first time period, a second position variant magnetic field to vary the magnetic field within said object in accordance with position along a third predetermined position transverse to said second predetermined direction such that the Larmor frequencies of the nuclear spins of said nuclei within said object vary as a function of the relative position of said nuclei along said third predetermined direction;

means, responsive to a fourth control signal, for irradiating said object during said second predetermined time period with a second signal having a second frequency spectrum substantially consisting of frequency components corresponding to a second predetermined band of Larmor frequencies such that the nuclear spins of nuclei located in another planar volume are reoriented by a predetermined angle with respect to the previous orientation thereof, said another planar volume intersecting said one planar volumes at a predetermined volume within said object, the nuclei located within said predetermined volume thereafter, during a third time period, generating spin echo signals at the respective Larmor frequencies thereof;

means, responsive to a fifth control signal, for generating, during said third time period a third position variant magnetic field to vary the intensity of the magnetic field within said object in accordance with position within said predetermined volume such that the Larmor frequencies of the nuclei vary as a function of relative position within said predetermined volume;

means, responsive to a sixth control signal, for determining the relative intensity of the frequency components of said spin echo signals, each of said spin echo frequency components being indicative of the relative density of nuclei disposed at an associated position within said predetermined volume; and means for repetitively generating said first, second, third, fourth, fifth and sixth control signals in sequence a first time and at least a second time after said first time, said generating means including means for modifying at least one of said first and second control signals and at least one of said third and fourth control signals so that further planar volumes defining further predetermined volumes disposed outside of previously excited planar volumes are excited, said generating means generating said second and fourth control signals for said at least a second time within a predetermined period after said first fourth control signal generation so that the last planar volume excitation occurs within the spin-lattice relaxation time of said another planar volume.

48. Apparatus for determining the relative densities of nuclei within an object, said nuclei having nuclear spins at Larmor frequencies in accordance with the intensity of a magnetic field operating thereon, said apparatus comprising:

means for disposing said object in an intense magnetic field to align the nuclear spins of nuclei in accordance with a first predetermined direction;

means, responsive to a first control signal, for generating for a first predetermined time period a first position variant magnetic field to vary the intensity of the magnetic field within said object in accordance with position along a second predetermined direction, said position varying magnetic field causing the Larmor frequencies of said nuclei to vary as a function of the relative positions of said nuclei along said second predetermined direction;

means, responsive to a second control signal, for irradiating said object during said first predetermined period with a first signal having a first frequency spectrum substantially consisting of components corresponding to a first predetermined band of Larmor frequencies, to selectively excite said nuclei having Larmor frequencies within said predetermined band, such that the nuclear spins of nuclei located in one planar volume of said object are reoriented by a first predetermined angle with respect to the previous orientation thereof;

means, responsive to a third control signal, for generating, during a second predetermined time period subsequent to said first time period, a second position variant magnetic field to vary the magnetic field within said object in accordance with position along a third predetermined direction transverse to said second predetermined direction such that the Larmor frequencies of the nuclear spins of said nuclei within said object vary as a function of the relative position of said nuclei along said third predetermined direction;

means, responsive to a fourth control signal, for irradiating said object during said second predetermined time period with a second signal having a second frequency spectrum substantially consisting of frequency components corresponding to a second predetermined band of Larmor frequencies such that the nuclear spins of nuclei located in another planar volume are reoriented by a second predetermined angle with respect to the previous orientation thereof, said another planar volume intersecting said one planar volume at a predetermined volume within said object, the nuclei located at the intersection of said one and another planar volumes thereafter during a third time period, generating spin echo signals at the respective Larmor frequencies thereof;

means, responsive to a fifth control signal, for generating, during said third time period a third position variant magnetic field to vary the intensity of the magnetic field within said object in accordance with position along said predetermined volume such that the Larmor frequencies of the nuclei vary as a function of relative position along said predetermined volume;

means, responsive to a sixth control signal, for determining the relative intensity of the frequency components of said spin echo signals, each of said spin echo signal frequency components being indicative of the relative density of nuclei disposed at an associated position along said predetermined volume; and means for repetitively generating said first, second, third, fourth, fifth and sixth control signals in sequence, said generating means including:

first means for generating said control signals at a first occasion and at a plurality of occasions after said first occasion during a first time segment, said first means including means for modifying at least one of said first and second control signals, and at least one of said third and fourth control signals so that at said plurality of occasions further planar volumes defining further predetermined volumes disposed outside of previously excited planar volumes are excited, said first means generating said second and fourth control signals at said plurality of occasions within a period after said first fourth control signal generation so that the last planar volume excitation occurs within the spin-lattice relaxation time of said another planar volume, and second means for generating said control signals at a first occasion and at a plurality of occasions after said first occasion during a second time segment after said first time segment, said second means including means for modifying at least one of said first and second control signals and at least one of said third and fourth control signals so that said second means excites, at the first occasion of the generation of said second and fourth control signals, at least one of said one and another planar volumes, and, said second means excites, at said plurality of occasions, further planar volumes defining further predetermined volumes disposed outside of planar volumes previously excited in response to control signals generated by said second means, said second means generating said second and fourth control signals at said plurality of occasions within a period after said first fourth control signal generation by said second means so that the last planar volume excitation occurs within the spin-lattice relaxation time of the first predetermined volume excitation in response to control signals generated by said second means.

49. Apparatus for determining the relative densities of nuclei within an object, said apparatus comprising:

means, responsive to a first control signal, for selectively exciting one region of said object to generate for a period of time a free induction decay signal (FID) having a polarity;

means, responsive to a second control signal, for selectively exciting another region transverse to said one region, at a predetermined time interval thereafter, the intersection of said one and another regions defining a predetermined volume, to generate from said predetermined volume a spin echo at a time in accordance with said predetermined time interval and within said period of time so that said FID interferes with said spin echo to produce a spin echo signal having a polarity and an FID component and a spin echo component;

means, responsive to a third control signal, for detecting the intensity of said spin echo signals to obtain a measure of the relative density of nuclei in said predetermined volume;

means for repetitively generating said first, second and third control signals in sequence a plurality of times, said generating means including means for controlling the phases of said excitations so that an arithmetic combination of the polarities of said FIDs is zero, and said arithmetic combination of the polarities of said spin echoes is not zero; and means for combining corresponding portions of said spin echo signals with said arithmetic combination so that said FID components cancel while said spin echo components do not cancel.

50. Apparatus as in claim 49 wherein:

said means responsive to said first control signal comprises:
  means for generating a position variant magnetic field having a predetermined intensity in said one region and only in said one region, and
  means for selectively irradiating said object with a first electromagnetic signal having a frequency range to cause nutation only in said one region;

said means responsive to said second control signal comprises:
  means for generating a position variant magnetic field across said object, the strength of said field having a predetermined value in said another region, and only in said another region, and
  means for irradiating said object with a second electromagnetic signal having a frequency range to cause nutation only in said another region;

said generating means generates said control signals a first time and a second time and further comprises means for altering said first and second control signals so that the phase of said first electromagnetic signal said first time produces an FID having a positive polarity, the phase of said second electromagnetic signal said first time is 90° with respect to said first electromagnetic signal to produce a spin echo having a positive polarity, the phase of said first electromagnetic signal said second time is 180° with respect to said first time first electromagnetic signal to produce an FID having a negative polarity and the phase of said second electromagnetic said second time is 0° with respect to said first time first electromagnetic signal to produce a spin echo having a positive polarity; and said combining means further comprises means for adding corresponding portions of said spin echo signals so that said FID components cancel and said spin echo components do not cancel.

51. Apparatus as in claim 49 wherein:

said means responsive to said first control signal comprises:
  means for generating a position variant magnetic field across said object, the intensity of said field having a predetermined value in said one region, and only in said one region, and
  means for selectively irradiating said object with a first electromagnetic signal having a frequency range to produce said nutation of nuclei only in said one region;

said means responsive to said second control signal comprises:
  means for generating a position variant magnetic field across said object, the intensity of said magnetic field having a predetermined value in said another region, and only in said another region, and
  means for irradiating said object with a second electromagnetic signal having a frequency range to cause nutation of nuclei only in said another region;

said control signal generates said generating means control signals a first, second, third and fourth time and further comprises:

means for altering said first control signal said first time to generate said first electromagnetic signal to produce an FID having a positive polarity,
  means for altering said second control signal said first time to generate said second electromagnetic signal having a phase of 90° with respect to said first time first electromagnetic signal to produce a spin echo having a positive polarity,
  means for altering said first control signal said second time to generate said first electromagnetic signal having a phase of 0° with respect to said first time first electromagnetic signal to produce an FID having a positive polarity,
  means for altering said second control signal said second time to generate said second electromagnetic signal having a phase of 270° with respect to said first time first electromagnetic signal to produce a spin echo having a positive polarity,
  means for altering said first control signal said third time to generate said first electromagnetic signal having a phase of 180° with respect to said first time first electromagnetic signal to produce an FID having a negative polarity,
  means for altering said second control signal said third time to generate said second electromagnetic signal having a phase of 0° of with respect to said first time first electromagnetic signal to produce a spin echo having a positive polarity,
  means for altering said first control signal said fourth time to generate said first electromagnetic signal having a phase of 180° with respect to said first time first electromagnetic signal to produce an FID having a negative polarity, and
  means for altering said second control signal said fourth time to generate said second electromagnetic signal having a phase of 180° with respect to said first time first electromagnetic signal to produce a spin echo having a positive polarity; and said combining means further comprises means for adding corresponding portions of said spin echo signals so that said FID components of said spin echo signals cancel while said spin echo components of said spin echo signals do not cancel.

52. Apparatus as in claim 49 wherein:

said means responsive to said first control signal comprises:
  means for generating a position variant magnetic field across said object, the intensity of said field having a predetermined value in said one region, and only in said one region, and
  means for selectively irradiating said object with a first electromagnetic signal having a frequency range to produce said nutation of nuclei only in said one region;

said means responsive to said second control signal comprises:
  means for generating a position variant magnetic field across said object, the intensity of said magnetic field having a predetermined value in said another region, and only in said another region, and
  means for irradiating said object with a second electromagnetic signal having a frequency range to cause said nutation of nuclei only in said another region;

said generating means generates said control signals first, second, third and fourth times and further comprises:

means for altering said first control signal said first time to generate said first electromagnetic signal to produce an FID having a positive polarity, means for altering said second control signal said first time to generate said second electromagnetic signal having a phase of 90° with respect to said first time first electromagnetic signal to produce a spin echo having a positive polarity, means for altering said first control signal said second time to generate said first electromagnetic signal having a phase of 180° with respect to said first time first electromagnetic signal to produce an FID having a negative polarity, means for altering said second control signal said second time to generate said second electromagnetic signal having a phase of 0° with respect to said first time first electromagnetic signal to produce a spin echo having a positive polarity, means for altering said first control signal said third time to generate said first electromagnetic signal having a phase of 0° with respect to said first time first electromagnetic signal to produce an FID having a positive polarity, means for altering said second control signal said third time to generate said second electromagnetic signal having a phase of 0° with respect to said first time first electromagnetic signal to produce a spin echo having a negative polarity, means for altering said first control signal said fourth time to generate said first electromagnetic signal having a phase of 180° with respect to said first time first electromagnetic signal to produce an FID having a negative polarity, and means for altering said second control signal said fourth time to generate said second electromagnetic signal having a phase of 90° with respect to said first time first electromagnetic signal to produce a spin echo having a negative polarity; and said combining means further comprises:

means for adding corresponding portions of the spin echo signals detected said first and second times to produce a first composite signal wherein said FID components cancel while said spin echo components do not cancel, means for adding corresponding portions of the spin echo signals detected in said third and fourth times to produce a second composite signal wherein said FID components cancel and said spin echo components do not cancel, and means for subtracting corresponding portions of said first composite signal from corresponding portions of said second composite signal to produce a signal having no FID component and a spin echo component.

53. Apparatus for determining the relative densities of nuclei within an object, said nuclei having nuclear spins at Larmor frequencies in accordance with the intensity of a magnetic field operating thereon, said apparatus comprising:

means, responsive to a first control signal, for selectively exciting one planar volume to nutate the nuclear spins of nuclei in said one planar volume by a first predetermined angle, the nuclei within said one planar volume thereafter, for a period of time, generating free a induction decay (FID) having a polarity;

means, responsive to a second control signal, for selectively exciting another planar volume transverse to said one planar volume, at a predetermined time interval thereafter, to nutate spins of nuclei in said another planar volume by a second predetermined angle, the intersection of said one and another planar volumes defining a predetermined volume, whereby the nuclei within said predetermined volume generate a spin echo at a time in accordance with said predetermined time interval and within said period of time so that said FID interferes with said spin echo to produce a spin echo signal having a polarity and an FID component and a spin echo component;

means, responsive to a third control signal, for detecting the intensity of said spin echo signals to obtain a measure of the density of nuclei in said predetermined volume;

means for repetitively generating said first, second and third control signals in sequence a plurality of times, said generating means including means for controlling the phases of said excitations so that an arithmetic combination of the polarities of said FIDs is zero, and said arithmetic combination of the polarities of said spin echoes is not zero; and means for combining corresponding portions of the spin echo signals with said arithmetic combination so that said FID components cancel while said spin echo components do not cancel.

54. Apparatus as in claim 53 wherein:

said means responsive to said first control signal comprises:

means for generating a position variant magnetic field having a predetermined intensity in said one planar volume and only in said one planar volume, and means for selectively irradiating said object with a first electromagnetic signal having a frequency range to cause said nutation only in said one planar volume;

said means responsive to said second control signal comprises:

means for generating a position variant magnetic field across said object, the strength of said field having a predetermined value in said another planar volume, and only in said another planar volume, and means for irradiating said object with a second electromagnetic signal having a frequency range to cause said nutation only in said another planar volume;

said generating means generates said control signals a first time and a second time and further comprises means for altering said first and second control signals so that the phase of said first electromagnetic signal said first time produces an FID having a positive polarity, the phase of said second electromagnetic signal said first time is 90° with respect to said first electromagnetic signal to produce a spin echo having a positive polarity, the phase of said first electromagnetic signal said second time is 180° with respect to said first time first electromagnetic signal to produce an FID having a negative polarity, and the phase of said second electromagnetic said second time is 0° with respect to said first time first electromagnetic signal to produce a spin echo having a positive polarity; and said combining means further comprises means for adding corresponding portions of said spin echo signals so that said FID components cancel and said spin echo components do not cancel.

55. Apparatus as in claim 53 wherein:

said means responsive to said first control signal comprises:

means for generating a position variant magnetic field across said object, the intensity of said field having a predetermined value in said one planar volume, and only in said one planar volume, and means for selectively irradiating said object with a first electromagnetic signal having a frequency range to produce said nutation of nuclei only in said one planar volume;

said means responsive to said second control signal comprises:

means for generating a position variant magnetic field across said object, the intensity of said magnetic field having a predetermined value in said another planar volume, and only in said another planar volume, and means for irradiating said object with a second electromagnetic signal having a frequency range to cause said nutation of nuclei only in said another planar volume;

said generating means generates said control signals first, second, third and fourth times and further comprises:

means for altering said first control signal said first time to generate said first electromagnetic signal to produce an FID having a positive polarity, means for altering said second control signal said first time to generate said second electromagnetic signal having a phase of 90° with respect to said first time first electromagnetic signal to produce a spin echo having a positive polarity, means for altering said first control signal said second time to generate said first electromagnetic signal having a phase of 0° with respect to said first time first electromagnetic signal to produce an FID having a positive polarity, means for altering said second control signal said second time to generate said second electromagnetic signal having a phase of 270° with respect to said first time first electromagnetic signal to produce a spin echo having a positive polarity, means for altering said first control signal said third time to generate said first electromagnetic signal having a phase of 180° with respect to said first time first electromagnetic signal to produce an FID having a negative polarity, means for altering said second control signal said third time to generate said second electromagnetic signal having a phase of 0° with respect to said first time first electromagnetic signal to produce a spin echo having a positive polarity, means for altering said first control signal said fourth time to generate said first electromagnetic signal having a phase of 180° with respect to said first time first electromagnetic signal to produce an FID having a negative polarity, and means for altering said second control signal said fourth time to generate said second electromagnetic signal having a phase of 180° with respect to said first time first electromagnetic signal to produce a spin echo having a positive polarity; and said apparatus further comprises means for adding corresponding portions of said spin echo signals so that said FID components of said spin echo signals cancel while said spin echo components of said spin echo signals do not cancel.

56. Apparatus as in claim 53 wherein:

said means responsive to said first control signal comprises:

means for generating a position variant magnetic field across said object, the intensity of said field having a predetermined value in said one planar volume, and only in said one planar volume, and means for selectively irradiating said object with a first electromagnetic signal having a frequency range to produce said nutation of nuclei only in said one planar volume;

said means responsive to said second control signal comprises:

means for generating a position variant magnetic field across said object, the intensity of said magnetic field having a predetermined value in said another planar volume, and only in said another planar volume, and means for irradiating said object with a second electromagnetic signal having a frequency range to cause said nutation of nuclei only in said another planar volume;

said generating means generates said control signals first, second, third and fourth times and further comprises:

means for altering said first control signal said first time to generate said first electromagnetic signal to produce an FID having a positive polarity, means for altering said second control signal said first time to generate said second electromagnetic signal having a phase of 90° with respect to said first time first electromagnetic signal to produce a spin echo having a positive polarity, means for altering said first control signal said second time to generate said first electromagnetic signal having a phase of 180° with respect to said first time first electromagnetic signal to produce an FID having a negative polarity, means for altering said second control signal said second time to generate said second electromagnetic signal having a phase of 0° with respect to said first time first electromagnetic signal to produce a spin echo having a positive polarity, means for altering said first control signal said third time to generate said first electromagnetic signal having a phase of 0° with respect to said first time first electromagnetic signal to produce an FID having a positive polarity, means for altering said second control signal said third time to generate said second electromagnetic signal having a phase of 0° with respect to said first time first electromagnetic signal to produce a spin echo having a negative polarity, means for altering said first control signal said fourth time to generate said first electromagnetic signal having a phase of 180° with respect to said first time first electromagnetic signal to produce an FID having a negative polarity, and means for altering said second control signal said fourth time to generate said second electromagnetic signal having a phase of 90° with respect to said first time first electromagnetic signal to produce a spin echo having a negative polarity; and
said combining means further comprises:
    means for adding corresponding portions of the spin echo signals detected said first and second times to produce a first composite signal wherein said FID components cancel while said spin echo components do not cancel,
    means for adding corresponding portions of the spin echo signals detected said third and fourth times to produce a second composite signal wherein said FID components cancel and said spin echo components do not cancel, and
    means for subtracting corresponding portions of said first composite signal from corresponding portions of said second composite signal to produce a signal having no FID component and a spin echo component.

57. Apparatus as in claim 45 or 53 wherein said first predetermined angle is 90° and said second predetermined angle is 180°.

58. Apparatus as in claim 43 or 53 wherein each of said means for exciting further comprises:
    means for generating a carrier having a predetermined frequency;
    means for controllably modulating said carrier to have predetermined frequency range;
    means for generating a position variant magnetic field having a predetermined strength in the excited planar volume and only in the excited planar volume, said predetermined strength causing nuclei in said planar volume to assume a Larmor frequency range equal to the frequency range of said modulated carrier; and
    means for irradiating said sample with said modulated carrier.

59. Apparatus as in claim 36, 45 or 53 further comprising means for initially aligning said spins in said object.

60. Apparatus for detecting the relative densities of nuclei within an object, said nuclei having nuclear spins at Larmor frequencies in accordance with the intensity of a magnetic field operating thereon, said apparatus comprising:
    means, responsive to a first control signal, for generating a first position variant magnetic field within said object, said position variant magnetic field causing the Larmor frequencies of nuclei in said object to vary as a function of the relative positions of said nuclei within said object;
    means, responsive to a second control signal, for irradiating said object during said first predetermined period with a signal having a first frequency spectrum substantially consisting of components corresponding to a first predetermined band of said nuclear Larmor frequencies, to selectively excite said nuclei in one planar volume having Larmor frequencies within said predetermined band, such that the nuclear spins of nuclei located in said one planar volume are reoriented by a first predetermined angle, the nuclei within said one planar volume thereafter generating for a period of time a free induction decay (FID) having a polarity;
    means, in response to a third control signal, for generating for a second predetermined time period a second position variant magnetic field to vary the intensity of the magnetic field within said object in accordance with position, said position variant magnetic field causing Larmor frequencies of said nuclei to vary as a function of the relative positions of said nuclei;
    means, in response to a fourth control signal, for irradiating said object during said second predetermined period with a signal having a second frequency spectrum substantially consisting of components corresponding to a second predetermined band of said nuclei Larmor frequencies, to selectively excite said nuclei having Larmor frequencies within another planar volume, transverse to said one planar volume, such that the nuclear spins of nuclei within said another planar volume are reoriented by a second predetermined angle, the intersection of said one and another planar volumes defining a predetermined volume, whereby the nuclei within said predetermined volume generate a spin echo at a time in accordance with said predetermined time interval and within said period of time so that said FID interferes with said spin echo to produce a spin echo signal having a polarity and an FID component and a spin echo component;
    means, responsive to a fifth control signal, for detecting the intensity of said spin echo signals to obtain a measure of the relative density of nuclei in said predetermined volume;
    means for repetitively generating said first, second, third, fourth and fifth control signals in sequence a plurality of times, said generating means including means for controlling the phases of said irradiations so that an arithmetic combination of the polarities of said FIDs is zero, and said arithmetic combination of the polarities of said spin echoes is not zero; and
    means for combining corresponding portions of the spin echo signals with said arithmetic combination so that said FID components cancel while said spin echo components do not cancel.

61. Apparatus as in claim 36, 37, 53 or 60 wherein said spin-lattice relaxation time is five $T_1$.

62. Apparatus for determining the relative densities of nuclei within an object, said nuclei having nuclear spins at Larmor frequencies in accordance with the intensities of a magnetic field operating thereon, said apparatus comprising:
    means, responsive to a first control signal, for selectively exciting one planar volume to nutate the nuclear spins of nuclei in said one planar volume by a first predetermined angle, the nuclei within said one planar volume thereafter generating for a period of time a free induction decay (FID) having a polarity;
    means, responsive to a second control signal, for reversing the nuclear spins of nuclei in another planar volume within said object transverse to said one planar volume at a predetermined time thereafter, the intersection of said one and another planar volumes defining a predetermined volume, said predetermined volume generating a spin echo centered in time at the point after said reversal equal to said predetermined time interval and within said period of time so that said FID interferes with said spin echo to produce a spin echo signal having a polarity and an FID component and a spin echo component;
    means, responsive to a third control signal, for detecting the intensity of said spin echo signals to obtain a measure of the relative density of nuclei in said predetermined volume;

means, for repetitively generating said first, second and third control signals in sequence a plurality of times, said generating means including means for controlling the phases of said excitations and reversals so that an arithmetic combination of the polarities of said FIDs is zero, and said arithmetic combination of the polarities of said spin echoes is not zero; and means for combining corresponding portions of said spin echo signals with said arithmetic combination so that said FID components cancel while said spin echo components do not cancel.

63. Apparatus as in claim 35, 36, 37, 39, 42, 53 or 62 wherein said relative density is selected from the group consisting of relative normal density, $T_1$ modified relative density, and $T_2$ modified relative density.

64. Apparatus for determining the relative densities of nuclei within an object, said nuclei having nuclear spins at Larmor frequencies in accordance with the intensity of a magnetic field operating thereon, said apparatus comprising:

means for disposing said object in an intense magnetic field to align the nuclear spins of said nuclei in accordance with a first predetermined direction;

means, responsive to a first control signal, for generating for a first predetermined time period a first position variant magnetic field to vary the intensity of the magnetic field within said object in accordance with position along a second predetermined direction, said position variant magnetic field causing the Larmor frequencies of said nuclei to vary as a function of the relative positions of said nuclei along said second predetermined direction;

means, responsive to a second control signal, for irradiating said object during said first predetermined period with a signal having a first frequency spectrum substantially consisting of components corresponding to a first predetermined band of said nuclei Larmor frequencies, to selectively excite said nuclei having Larmor frequencies within said predetermined bands, such that nuclear spins of nuclei located in one planar volume in said object are reoriented by a first predetermined angle with respect to the previous orientation thereof, the nuclei within said first predetermined plane thereafter generating for a period of time a free induction decay (FID) having a polarity;

means, responsive to a third control signal, for generating during a second predetermined time period subsequent to said first time period, a second position variant magnetic field to vary the magnetic field within said object in accordance with position along a third predetermined direction transverse to said second predetermined direction such that the Larmor frequencies of the nuclear spins of said nuclei within said object vary as a function of the relative position of said nuclei along said third predetermined direction;

means, responsive to a fourth control signal, for irradiating said object during said second predetermined time period with a second signal having a second frequency spectrum substantially consisting of frequency components corresponding to a second predetermined band of Larmor frequencies such that the nuclear spins of nuclei located in another planar volume are reoriented by a second predetermined angle with respect to the previous orientation thereof, said another planar volume intersecting said one planar volume at a predetermined volume within said object, the nuclei located in said predetermined volume thereafter, during a third time period, generating a spin echo at a time in accordance with said predetermined time interval and within said period of time so that said FID interferes with said spin echo to produce a spin echo signal having a polarity and an FID component and a spin echo component;

means, responsive to a fifth control signal, for generating during said third time period a third position variant magnetic field to vary the intensity of the magnetic field within said object in accordance with the position within said predetermined volume such that the Larmor frequencies of the nuclei vary as a function of relative position within said predetermined volume;

means, responsive to a sixth control signal, for determining the relative intensity of the frequency components of said spin echo signals, each of said spin echo signal frequency components being indicative of the relative density of nuclei disposed and an associated position within said predetermined volume;

means for repetitively generating said first, second, third, fourth, fifth and sixth control signals in sequence a plurality of times, said generating means including means for controlling the phases of said irradiations so that an arithmetic combination of the polarities of said FIDs is zero, and said arithmetic combination of the polarities of said spin echoes is not zero; and means for combining corresponding portions of said spin echo signals with said arithmetic combination so that said FID components cancel while said spin echo components do not cancel.

65. A method as in claims 4, 6, 10 and 17 wherein said first and second predetermined volumes are substantially coextensive.

* * * * *

UNITED STATES PATENT AND TRADEMARK OFFICE
Certificate

Patent No. 4,318,043                                                          Patented March 2, 1982

On petition requesting issuance of a certificate for correction of inventorship pursuant to 35 USC 256, it has been found that the above-identified patent, through error and without any deceptive intent, improperly sets forth the inventorship. Accordingly, it is hereby certified that the correct inventorship of this patent is Lawrence E. Crooks, John C. Hoenninger, III, Mitsuaki Mrakawa and Jerome R. Singer.

Signed and Sealed this Eighteenth Day of March 1986

BRADLEY R. GARRIS,
*Office of the Deputy Assistant Commissioner for Patents.*

Disclaimer

4,318,043.—*Lawrence E. Crooks*, Richmond; *John C. Hoenninger III*, Berkeley; and *Mitsuaki Mrakawa*, San Mateo, Calif. METHOD AND APPARATUS FOR RAPID NMR IMAGING OF NUCLEAR DENSITIES WITHIN AN OBJECT. Patent dated Mar. 2, 1982. Disclaimer filed Mar. 13, 1984, by the assignee, *The Regents of the University of California.*

The term of this patent subsequent to Oct. 27, 1998, has been disclaimed.
[*Official Gazette May 15, 1984.*]